(12) United States Patent
Yo et al.

(10) Patent No.: US 8,420,446 B2
(45) Date of Patent: Apr. 16, 2013

(54) CIRCUIT MEMBER, MANUFACTURING METHOD OF THE CIRCUIT MEMBER, AND SEMICONDUCTOR DEVICE INCLUDING THE CIRCUIT MEMBER

(75) Inventors: Shimazaki Yo, Tsurugashima (JP);
Hiroyuki Saito, Tokorozawa (JP);
Masachika Masuda, Tokorozawa (JP);
Kenji Matsumura, Iruma-Gun (JP);
Masaru Fukuchi, Saitama (JP); Takao Ikezawa, Shinjuku-Ku (JP)

(73) Assignee: Dai Nippon Printing Co., Ltd., Shinjuku-Ku (JP)

( * ) Notice: Subject to any disclaimer, the term of this patent is extended or adjusted under 35 U.S.C. 154(b) by 167 days.

(21) Appl. No.: 13/012,268

(22) Filed: Jan. 24, 2011

(65) Prior Publication Data

US 2011/0117704 A1    May 19, 2011

Related U.S. Application Data

(62) Division of application No. 12/095,014, filed as application No. PCT/JP2006/323703 on Nov. 28, 2006, now abandoned.

(30) Foreign Application Priority Data

Nov. 28, 2005   (JP) .................................. 2005-341399

(51) Int. Cl.
*H01L 21/58*   (2006.01)

(52) U.S. Cl.
USPC .................................. 438/123; 257/E21.505

(58) Field of Classification Search .................. 438/123; 257/E21.505, 123
See application file for complete search history.

(56) References Cited

U.S. PATENT DOCUMENTS

| | | | |
|---|---|---|---|
| 3,981,691 A | * | 9/1976 | Cuneo ........................... 428/626 |
| 5,446,313 A | | 8/1995 | Masuda et al. |
| 6,025,640 A | | 2/2000 | Yagi et al. |

(Continued)

FOREIGN PATENT DOCUMENTS

| JP | 08-046116 A1 | 2/1996 |
|---|---|---|
| JP | 09-232499 A1 | 9/1997 |

(Continued)

OTHER PUBLICATIONS

Japanese Office Action dated May 8, 2012 (with English translation).

*Primary Examiner* — Ha Nguyen
*Assistant Examiner* — Jordan Klein
(74) *Attorney, Agent, or Firm* — Burr & Brown

(57) ABSTRACT

A circuit member includes a lead frame material having a die pad, a lead part to be electrically connected with a semiconductor chip, and an outer frame configured to support the die pad and the lead part. The lead frame material includes a resin sealing region. Roughened faces, each having an average roughness Ra of 0.3 μm or greater, are formed on a surface in the resin sealing region of the lead frame material. The surface of the lead frame material except for the resin sealing region is a flat and smooth face. A two-layer plated layer formed by laminating a Ni plated layer and a Pd plated layer in this order or a three-layer plated layer formed by laminating the Ni plated layer, the Pd plated layer and an Au plated layer in this order is formed on the whole surface of the lead frame material.

11 Claims, 8 Drawing Sheets

U.S. PATENT DOCUMENTS

| | | |
|---|---|---|
| 6,201,292 B1 | 3/2001 | Yagi et al. |
| 6,221,696 B1 * | 4/2001 | Crema et al. .................. 438/127 |
| 6,831,372 B2 * | 12/2004 | Ruhland ....................... 257/783 |
| 7,049,683 B1 * | 5/2006 | Sirinorakul et al. ........... 257/666 |
| 7,190,057 B2 * | 3/2007 | Seki et al. ..................... 257/678 |
| 7,205,180 B1 * | 4/2007 | Sirinorakul et al. ........... 438/123 |
| 2002/0153596 A1 * | 10/2002 | Tsubosaki et al. ............. 257/666 |
| 2004/0207056 A1 * | 10/2004 | Seki et al. ..................... 257/676 |
| 2004/0232534 A1 | 11/2004 | Seki et al. |
| 2006/0097366 A1 | 5/2006 | Sirinorakul et al. |

FOREIGN PATENT DOCUMENTS

| | | |
|---|---|---|
| JP | 10-199905 A1 | 7/1998 |
| JP | 10-265872 A1 | 10/1998 |
| JP | 11-029883 A1 | 2/1999 |
| JP | 11-040720 A1 | 2/1999 |
| JP | 2000-269401 A1 | 10/2001 |
| JP | 2005-079524 A1 | 3/2005 |

* cited by examiner

CIRCUIT MEMBER, MANUFACTURING METHOD OF THE CIRCUIT MEMBER, AND SEMICONDUCTOR DEVICE INCLUDING THE CIRCUIT MEMBER

CROSS REFERENCE TO RELATED APPLICATIONS

This application is a division of U.S. patent application Ser. No. 12/095,014 filed Jul. 17, 2008, which was the National Stage of International Application No. PCT/JP2006/323703 filed Nov. 28, 2006, and claims the benefit under 35 USC §119(a)-(d) from Japanese Patent Application No. 2005-341399 filed Nov. 28, 2005; the entireties of which are incorporation herein by reference.

FIELD OF THE INVENTION

The present invention relates to a circuit member configured to be electrically connected with a semiconductor chip so as to constitute a part of a semiconductor device, and in particular relates to the circuit member which can enhance reliability of the semiconductor device that is finally obtained. In addition, the present invention relates to a manufacturing method by which such a circuit member can be produced. Furthermore, such the present invention relates to the semiconductor device including the circuit member and exhibiting higher reliability.

BACKGROUND OF THE INVENTION

In recent years, the semiconductor device has been made to exhibit a higher function and have a more highly integrated structure, and has been mounted on a variety of electronic equipment. Additionally, the semiconductor device has brought greater facility to the life in society and become necessary and essential for the life in society. Thus, a fault of the semiconductor device might have a higher possibility to cause a serious damage to the life in society. Therefore, the reliability is a quite essential factor for the semiconductor device.

The semiconductor device has been loaded on a variety of electronic equipment. Accordingly, the environment in which the semiconductor device is used has also changed variously. Furthermore, the outer dimension of the semiconductor device varies depending on the electronic equipment on which the semiconductor device is loaded. In particular, in recent years, a package of the semiconductor device has been gradually miniaturized and formed into a thinner type.

As an example of such a package for the semiconductor device, an SOJ (Small Outline J-Leaded Package), QFP (Quad Flat Package) or SOP (Small Outline Package) type is known, in which external lead wires extend from each side of the semiconductor device. Otherwise, a QFN (Quad Flat Non-leaded Package) or SON (Small Outline Non-leaded Package) type, in which external lead wires extend from a bottom portion of the semiconductor device, is also known.

In either of such packages for the semiconductor device, the semiconductor chip is loaded on a top surface of a die pad of a lead frame. In this case, a lead part of the lead frame is electrically connected with the semiconductor chip via bonding wires. In addition, the lead frame, semiconductor device and bonding wires are sealed together by an electrically insulating resin such that a part of the lead part of the lead frame can be exposed outside. The semiconductor device including such a package is commonly referred to as a resin-sealed (type) semiconductor device.

In such a semiconductor device including the resin-sealed semiconductor package, there should be an interface, at which the die pad and the lead part, both formed from a metal as parts of the lead frame, are in contact with the sealing resin. In this case, there is a problem of adhesion strength (or joining strength) between the metal and the resin in such an interface region.

If the adhesion strength between the die pad and lead part of the lead frame and the sealing resin is substantially low, peeling between the die pad and lead part of the lead frame and the sealing resin may tend to occur, thus causing a crack in the sealing resin due to such peeling, and even bringing the semiconductor device into a fault, during a manufacturing process of the semiconductor device, during a process of assembling the semiconductor device onto an implementing substrate (or printed circuit board) that will be further mounted onto the electric equipment, and/or during use of such electronic equipment. That is to say, due to lack or insufficiency of the adhesion strength between the die pad and lead part of the lead frame relative to the sealing resin, the reliability of the semiconductor device will be deteriorated.

Research and development for addressing or solving such problems have been reported in, for example, the Japanese Patent Laid-Open Publication No. 2000-269401 (see, for example, claim 1) and the Japanese Patent Laid-Open Publication No. 11-40720 (see, for example, claim 1 and paragraph [0008]).

The Japanese Laid-Open Patent Publication No. 2000-269401 A1 discloses a plurality of semi-spherical dimples formed on both a top surface and a bottom surface of the die pad of the lead frame. With such a lead frame, a joining area between the lead frame and the sealing resin can be substantially increased. As a result, positive improvement of the adhesion strength between the lead frame and the sealing resin can be expected. In this case, however, no measure is taken for the lead part of the lead frame. Accordingly, the adhesion strength at the interface between the lead part and the sealing resin cannot be enhanced. In particular, the interface between the lead part and the sealing resin is exposed to the outside air. That is to say, the adhesion strength, at such an interface through which moisture or the like may first penetrate, is left unimproved in such a level that has been conventionally seen. Therefore, the reliability of the semiconductor device cannot be sufficiently improved.

The Japanese Laid-Open Patent Publication No. 11-040720 A1 discloses roughening of a surface of a resin sealing region of a lead frame material as well as application of Ni plating and Pd plating, in this order, to the roughened surface. In this case, in a face roughening process of a copper-alloy material, an organic-acid type etching liquid (e.g., in one embodiment, a micro-etching liquid CZ8100 produced by MEC Co., Ltd.) is used. In fact, the organic-acid type etching liquid is effective in the ease of roughening a copper surface formed by plating. Furthermore, the organic-acid type etching liquid can also enhance a degree of roughening the surface of a rolled copper plate or rolled copper-alloy plate, such as the lead frame material. However, in the case of using the organic-acid type etching liquid for the rolled copper plate or rolled copper-alloy plate, such as the lead frame material, it will be impossible or quite difficult to form a surface profile including finely pointed needle-like projections. Accordingly, it will also be impossible to sufficiently enhance the adhesion strength between the lead frame formed from the rolled copper plate or rolled copper-alloy plate and the sealing resin.

In order to secure enough the reliability of the semiconductor device, it is important not only to enhance the adhesion strength between the circuit member and the sealing resin but also to enhance adhesiveness between the lead part (or internal leads) and the bonding wires for electrically connecting the lead part of the circuit member to the semiconductor chip. Besides, it is also important to enhance the adhesiveness between the lead part (or external leads) and soldering portions for electrically connecting the lead part of the circuit member to the implementing substrate (or printed circuit board). Furthermore, it is also important to enhance sealing ability of the sealing resin to the circuit member. In addition, improvement of other properties of the circuit member may also enhance the reliability of the semiconductor device including the circuit member.

SUMMARY OF THE INVENTION

The present invention was made in view of challenges as described above, and therefore it is an object to provide the circuit member which can enhance the reliability of the semiconductor device that is finally obtained. It is another object of the present invention to provide the manufacturing method for producing the circuit member which can enhance the reliability of the semiconductor device. It is still another object of the present invention to provide the semiconductor device having significantly higher reliability.

With intensive studies for achieving the above objects, we have found that the reliability of the semiconductor device that is finally obtained can be significantly enhanced by forming a predetermined roughened face or faces on a surface of the lead frame material of the circuit member as well as by forming a plated layer or layers on the surface of the lead frame material. More specifically, we have found that the adhesiveness between the circuit member and the sealing resin can be markedly enhanced by forming the roughened face or faces having a predetermined surface roughness on the surface of the lead frame material. Besides, we have found that the adhesiveness between the lead part and the bonding wire that can be used for the electrical connection relative to the semiconductor chip and/or adhesiveness between the lead part and soldering portion that can be used for the electrical connection relative to the implementing substrate (or printed circuit board) can be highly improved by laminating a plated layer, such as a Ni plated layer (this term will also be used below as one meaning a nickel plated layer), a Pd plated layer (this term will also be used below as one meaning a palladium plated layer), an Au plated layer (this term will also be used below as one meaning a gold plated layer), and/or an Ag plated layer (this term will also be used below as one meaning a silver plated layer), on the surface of the lead frame material (lead frame body, lead frame member). The present invention is based on such knowledge and/or discovery, and is intended to enhance the reliability of the semiconductor device, by improving the adhesiveness between the circuit member and the sealing resin as well as by enhancing the adhesiveness between the circuit member and the bonding wire and/or soldering portion.

A first circuit member according to the present invention comprises a lead frame material including a die pad, a lead part adapted to be electrically connected with a semiconductor chip to be mounted on the die pad, and an outer frame configured to support the die pad and the lead part, the lead frame material being formed from a rolled copper plate or a rolled copper-alloy plate, wherein the lead frame material includes a resin sealing region to be sealed by a resin, together with the semiconductor chip mounted on the die pad, wherein the lead frame material includes a roughened face, having an average roughness Ra of 0.3 µm or greater, formed on a surface in the resin sealing region of the lead frame material, and a flat and smooth face, having the average roughness Ra less than that of the roughened face, on a surface outside the resin sealing region of the lead frame material, and wherein a two-layer plated layer formed by laminating a Ni plated layer and a Pd plated layer in this order, or a three-layer plated layer fowled by laminating the Ni plated layer, the Pd plated layer and an Au plated layer in this order, is provided on a whole surface of the lead frame material.

According to the first circuit member of this invention, the roughened face having the average roughness Ra of 0.3 µm or greater is formed on a portion or the surface in the resin sealing region of the lead frame material. Accordingly, the joining area between the circuit member and the sealing resin can be increased, so that sufficiently improved anchor effect can be provided between the circuit member and the sealing resin. Consequently, the joining strength between the circuit member and the sealing resin can be enhanced. Meanwhile, the surface outside the resin sealing region of the lead frame material is a flat and smooth face. Therefore, upon sealing with the resin, occurrence of a resin bar or leakage of the resin can be prevented by closely contacting a resin sealing mold (or jig (tooling)) to the lead part (or external leads) of the circuit member. Moreover, the two-layer plated layer formed by laminating the Ni plated layer and the Pd plated layer in this order, or the three-layer plated layer formed by laminating the Ni plated layer, the Pd plated layer and the Au plated layer in this order, is provided on the whole surface of the lead frame material. Accordingly, for example, upon connecting the bonding wire with the lead part, the adhesiveness between the bonding wire and the lead part can be enhanced. In addition, upon connecting the lead part with the implementing substrate (or printed circuit board) by soldering, the adhesiveness between the implementing substrate and the lead part can be enhanced. Thus, by using this circuit member, the semiconductor device having higher reliability can be provided.

In the first circuit member according to this invention, the roughened face may be formed on a top surface, a side surface and a bottom surface, in the resin sealing region of the lead frame material. According to this circuit member, the joining area between the circuit member and the sealing resin can be securely increased, thereby enhancing the adhesiveness between the circuit member and the sealing resin.

In the first circuit member according to this invention, the thickness of the Ni plated layer may be within a range of from 0.2 µm to 2 µm. Due to this circuit member, for example, upon connecting the bonding wire with the lead part or upon connecting the lead part with the implementing substrate (or printed circuit board) by soldering, diffusion of copper into a connected face can be prevented. Therefore, the adhesiveness between the bonding wire and the lead part can be enhanced, as well as the adhesiveness between the implementing substrate and the lead part can be improved.

Additionally, in the first circuit member according to this invention, the thickness of the Pd plated layer may be within a range of from 0.005 µM to 0.2 µm. According to such a circuit member, the thickness of the Pd plated layer is considerably reduced. Therefore, the adhesiveness between the circuit member and the sealing resin can be enhanced.

In addition, in the first circuit member according to this invention, the thickness of the Au plated layer may be within a range of from 0.003 µm to 0.015 µm. According to this circuit member, the thickness of the Au plated layer is positively reduced. Accordingly the adhesiveness between the circuit member and the sealing resin can be securely enhanced.

Furthermore, in the first circuit member according to this invention, the lead part may be positioned so as to surround the die pad from four sides or to surround the die pad from opposite two sides, in a plane substantially the same as the die pad, and the lead part may include a plurality of lead line parts each extending from a portion in the vicinity of the die pad to the outside of the resin sealing region. By using such a circuit member, the QFP type or SOP type semiconductor device can be produced, in which the circuit member and the sealing resin are firmly joined relative to each other.

A second circuit member according to the present invention comprises a lead frame material including a die pad, a lead part adapted to be electrically connected via a bonding wire with a semiconductor chip to be mounted on the die pad, and an outer frame configured to support the die pad and the lead part, the lead frame material being formed from a rolled copper plate or a rolled copper-alloy plate, wherein the lead frame material includes a resin sealing region to be sealed by a resin, together with the semiconductor chip mounted on the die pad and the bonding wire, wherein a single plated layer composed of an Ag plated layer, a two-layer plated layer formed by laminating a Ni plated layer and a Pd plated layer in this order, or a three-layer plated layer formed by laminating the Ni plated layer, the Pd plated layer and an Au plated layer in this order, is provided on a surface of the die pad opposed to the semiconductor chip as well as on a portion, to be connected with the bonding wire, of a surface of the lead part, and wherein the lead frame material includes a roughened face formed on a portion except an area on which the plated layer is formed of a surface in the resin sealing region of the lead frame material, the roughened face having an average roughness Ra of 0.3 μm or greater, and a flat and smooth face, having the average roughness Ra less than that of the roughened face, on a surface outside the resin sealing region of the lead frame material.

According to the second circuit member of this invention, the roughened face having the average roughness Ra of 0.3 μm or greater is formed on the portion, on which the plated layer is not formed, of the surface in the resin sealing region of the lead frame material. Thus, the joining area between the circuit member and the sealing resin can be increased, so that sufficiently improved anchor effect can be provided between the circuit member and the sealing resin. Consequently, the joining strength between the circuit member and the sealing resin can be enhanced. In addition, the surface outside the resin sealing region of the lead frame material is a flat and smooth face. Therefore, upon sealing with the resin, the resin sealing mold (or jig) can be closely contacted to the lead part (or external leads) of the circuit member, thereby preventing occurrence of the resin bar or leakage of the resin. Moreover, the single plated layer composed of the Ag plated layer, the two-layer plated layer formed by laminating the Ni plated layer and the Pd plated layer in this order, or the three-layer plated layer formed by laminating the Ni plated layer, the Pd plated layer and the Au plated layer in this order, is formed on the face of the die pad opposed to the semiconductor chip as well as on the portion of the surface of the lead part connected with the bonding wire. Accordingly, for example, upon connecting the bonding wire with the lead part, the adhesiveness between the bonding wire and the lead part can be enhanced. From these features, by employing this circuit member, the semiconductor device having higher reliability can be provided.

In the second circuit member according to this invention, a plated layer may be formed on a top surface of the die pad as well as on a portion, to be connected with the bonding wire, of a top surface of the lead part, and the roughened face may be formed on a portion of a top surface, a side surface and a bottom surface, in the resin sealing region of the lead frame material. Due to such a circuit member, the joining area between the circuit member and the sealing resin can be increased, thereby to enhance the adhesiveness between the circuit member and the sealing resin.

In the second circuit member according to this invention, the thickness of the Ni plated layer may be within a range of from 0.2 μm to 2 μm. By utilizing this circuit member, for example, upon connecting the bonding wire to the lead part, the diffusion of copper into the connected face can be prevented. Accordingly, the adhesiveness between the bonding wire and the lead part can be significantly enhanced.

Additionally, in the second circuit member according to this invention, the thickness of the Pd plated layer may be within a range of from 0.005 μm to 0.2 μm. In this circuit member, the thickness of the Pd plated layer is positively reduced. Thus, the adhesiveness between the circuit member and the sealing resin can be securely enhanced.

Furthermore, in the second circuit member according to this invention, the thickness of the Au plated layer may be within a range of from 0.003 μm to 0.015 μm. With such a circuit member, the thickness of the Au plated layer is significantly reduced. Therefore, the adhesiveness between the circuit member and the sealing resin can be securely enhanced.

In addition, in the second circuit member according to this invention, the lead part may be positioned so as to surround the die pad from four sides or to surround the die pad from opposite two sides, in a plane substantially the same as the die pad, and the lead part may include a plurality of lead line parts each extending from a portion in the vicinity of the die pad to the outside of the resin sealing region. By utilizing this circuit member, the QFP type or SOP type semiconductor device can be produced, in which the circuit member and the sealing resin are firmly joined relative to each other.

A first manufacturing method for a circuit member according to the present invention comprises the steps of: providing a lead frame material made from a rolled copper plate or a rolled copper-alloy plate, the lead frame material including a die pad, a lead part adapted to be electrically connected with a semiconductor chip to be mounted on the die pad, and an outer frame configured to support the die pad and the lead part; forming a roughened face, having an average roughness Ra of 0.3 μm or greater, on a surface in a resin sealing region of the lead frame material by using a micro-etching liquid mainly containing hydrogen peroxide and sulfuric acid, the resin sealing region being adapted to be sealed by a resin together with the semiconductor chip mounted on the die pad; and forming a two-layer plated layer formed by laminating a Ni plated layer and a Pd plated layer in this order, or a three-layer plated layer formed by laminating the Ni plated layer, the Pd plated layer and an Au plated layer in this order, on a whole surface of the lead frame material in which the roughened face is partially formed. According to the first manufacturing method for the circuit member, the aforementioned first circuit member related to this invention can be produced.

In the first manufacturing method for the circuit member according to this invention, the roughened face may be fowled on a top surface, a side surface and a bottom surface, in the resin sealing region of the lead frame material.

Alternatively or additionally, the step of forming the roughened face in the first manufacturing method for the circuit member related to this invention may include the steps of: holding the lead frame material from both sides, by using a jig configured to surround the resin sealing region of the lead frame material so as to mask a region outside the resin sealing region; and discharging the micro-etching liquid into the jig from both sides of the lead frame material so as to fill the interior of the jig surrounding the resin sealing region of the lead frame material with the micro-etching liquid. Alternatively, the step of forming the roughened face in the first manufacturing method for the circuit member according to this invention may include the steps of: sticking protective films onto both sides of the lead frame material, each protective film having an opening formed therein to expose the resin sealing region of the lead frame material; and injecting the micro-etching liquid toward the inside of the openings of the protective films from both sides of the lead frame material. Alternatively, the step of forming the roughened face in the first manufacturing method for the circuit member according to this invention may include the steps of: sticking protective films onto both sides of the lead frame material, each protective film having an opening formed therein to expose the resin sealing region of the lead frame material; and immersing the lead frame material, with the protective films stuck onto the lead frame material, in the micro-etching liquid. With such manufacturing methods for the circuit member, the roughened face that can enhance the joining strength relative to the sealing resin can be formed with higher precision in a desired position of the lead frame material.

A second manufacturing method for a circuit member according to the present invention comprises the steps of: providing a lead frame material made from a rolled copper plate or a rolled copper-alloy plate, the lead frame material including a die pad, a lead part adapted to be electrically connected via bonding wire with a semiconductor chip to be mounted on the die pad, and an outer frame configured to support the die pad and the lead part; forming a single plated layer composed of an Ag plated layer, a two-layer plated layer formed by laminating a Ni plated layer and a Pd plated layer in this order, or a three-layer plated layer formed by laminating the Ni plated layer, the Pd plated layer and an Au plated layer in this order, on a surface of the die pad opposed to the semiconductor chip as well as on a portion, to be connected with the bonding wire, of a surface of the lead part; and forming a roughened face having an average roughness Ra of 0.3 µm or greater on a portion except an area on which the plated layer is formed of a surface of a resin sealing region of the lead frame material by using a micro-etching liquid mainly containing hydrogen peroxide and the sulfuric acid, the resin sealing region being adapted to be sealed by a resin, together with the semiconductor chip located on the die pad and the bonding wire. According to the second manufacturing method for the circuit member, the aforementioned second circuit member related to this invention can be produced.

In the second manufacturing method for the circuit member according to this invention, the plated layer may be formed on a top surface of the die pad as well as on a portion, connected with the bonding wire, of a top surface of the lead part, and the roughened face may be formed on a portion of a top surface, a side surface and a bottom surface, in the resin sealing region of the lead frame material.

Alternatively or additionally, the step of forming the roughened face of the second manufacturing method for the circuit member related to this invention may include the steps of: holding the lead frame material from both sides, by using a jig configured to surround the resin sealing region of the lead frame material so as to mask a region outside the resin sealing region; and discharging the micro-etching liquid into the jig from both sides of the lead frame material so as to fill the interior of the jig surrounding the resin sealing region of the lead frame material with the micro-etching liquid. Alternatively, the step of forming the roughened face of the second manufacturing method for the circuit member according to this invention may include the steps of: sticking protective films onto both sides of the lead frame material, each protective film having an opening formed therein to expose the resin sealing region of the lead frame material; and injecting the micro-etching liquid toward the inside of the openings of the protective films from both sides of the lead frame material. Alternatively, the step of forming the roughened face of the second manufacturing method for the circuit member according to this invention may include the steps of: sticking protective films onto both sides of the lead frame material, each protective film having an opening formed therein to expose the resin sealing region of the lead frame material; and immersing the lead frame material, with the protective films stuck onto the lead frame material, in the micro-etching liquid. With such manufacturing methods for the circuit member, the roughened face that can enhance the joining strength relative to the sealing resin can be formed with higher precision in a desired position of the lead frame material.

A first semiconductor device according to the present invention comprises: a semiconductor chip; a circuit member including a lead frame material having a die pad onto which the semiconductor chip is mounted, and a lead part electrically connected with the semiconductor chip located on the die pad, the lead frame material being formed from a rolled copper plate or a rolled copper-alloy plate; a bonding wire electrically connecting the semiconductor chip located on the die pad with the lead part; and an electrically insulating sealing resin sealing the circuit member, the semiconductor chip and the bonding wire, such that a portion of the lead part of the circuit member can be exposed, wherein the lead frame material includes a resin sealing region sealed by the sealing resin, together with the semiconductor chip located on the die pad, wherein the lead frame material includes a roughened face, having an average roughness Ra of 0.3 µm or greater, formed on a surface in the resin sealing region of the lead frame material, and a flat and smooth face, having the average roughness Ra less than that of the roughened face, on a surface outside the resin sealing region of the lead frame material, and wherein a two-layer plated layer formed by laminating a Ni plated layer and a Pd plated layer in this order, or a three-layer plated layer formed by laminating the Ni plated layer, the Pd plated layer and an Au plated layer in this order, is provided on a whole surface of the lead frame material.

According to the first semiconductor device of this invention, the roughened face having the average roughness Ra of 0.3 µm or greater is formed on a portion or the surface in the resin sealing region of the lead frame material of the circuit member. Thus, the joining region between the circuit member and the sealing resin can be adequately increased, as well as sufficiently improved anchor effect can be provided between the circuit member and the sealing resin. Consequently, the joining strength between the circuit member and the sealing resin can be securely enhanced. In addition, the surface located outside the resin sealing region of the lead frame material of the circuit member is a flat and smooth face. Accordingly, upon sealing with the resin, occurrence of the resin bar or leakage of the resin can be prevented by closely contacting a resin sealing mold (or jig) to the lead part (or external leads) of the circuit member. Moreover, the two-layer plated layer formed by laminating the Ni plated layer and the Pd plated layer in this order, or the three-layer plated layer formed by laminating the Ni plated layer, the Pd plated layer and the Au plated layer in this order, is formed on the whole surface of the lead frame material of the circuit member. Therefore, the adhesiveness between the bonding wire and the lead part can be enhanced. In addition, for example, upon connecting the lead part with the implementing substrate (or printed circuit board) by soldering, the adhesiveness between the implementing substrate and the lead part can be improved.

In the first semiconductor device according to this invention, the roughened face may be formed on a top surface, a side surface and a bottom surface, in the resin sealing region of the lead frame material. With this semiconductor device, the joining area between the circuit member and the sealing resin can be significantly increased, thereby enhancing the adhesiveness between the circuit member and the sealing resin.

A second semiconductor device according to the present invention comprises: a semiconductor chip; a circuit member including a lead frame material having a die pad onto which the semiconductor chip is mounted, and a lead part electrically connected with the semiconductor chip located on the die pad, the lead frame material being formed from a rolled copper plate or a rolled copper-alloy plate; a bonding wire electrically connecting the semiconductor chip located on the die pad with the lead part; and an electrically insulating sealing resin sealing the circuit member, the semiconductor chip and the bonding wire, such that a portion of the lead part of the circuit member can be exposed, wherein a single plated layer composed of an Ag plated layer, a two-layer plated layer formed by laminating a Ni plated layer and a Pd plated layer in this order, or a three-layer plated layer formed by laminating the Ni plated layer, the Pd plated layer and an Au plated layer in this order, is provided on a surface of the die pad opposed to the semiconductor chip as well as on a portion, connected with the bonding wire, of a surface of the lead part, and wherein the lead frame material includes a resin sealing region sealed by the sealing resin, together with the semiconductor chip located on the die pad, wherein the lead frame material includes a roughened face formed on a portion except an area on which the plated layer is formed of a surface in the resin sealing region of the lead frame material, the roughened face having an average roughness Ra of 0.3 μM or greater, and a flat and smooth face, having the average roughness Ra less than that of the roughened face, on a surface outside the resin sealing region of the lead frame material, and wherein a solder plated layer for facilitating soldering joint is fowled on a surface of the exposed portion of the lead part.

According to the second semiconductor device of the present invention, the roughened face having the average roughness Ra of 0.3 μm or greater is formed on the portion, on which the plated layer is not formed, of the surface in the resin sealing region of the lead frame material of the circuit member. Thus, the joining region between the circuit member and the sealing resin can be adequately increased, so that sufficiently improved anchor effect can be provided between the circuit member and the sealing resin. Consequently, the joining strength between the circuit member and the sealing resin can be securely improved. In addition, the surface located outside the resin sealing region of the lead frame material of the circuit member is a flat and smooth face. Accordingly, upon sealing with the resin, occurrence of the resin bar or leakage of the resin can be prevented by closely contacting a resin sealing mold (or jig) to the lead part (or external leads) of the circuit member. Moreover, the single plated layer composed of the Ag plated layer, the two-layer plated layer formed by laminating the Ni plated layer and the Pd plated layer in this order, or the three-layer plated layer formed by laminating the Ni plated layer, the Pd plated layer and the Au plated layer in this order, is provided on the face of the die pad opposed to the semiconductor chip as well as on the portion of the surface of the lead part connected with the bonding wire. Therefore, the adhesiveness between the bonding wire and the lead part can be enhanced. Additionally, the solder plated layer for facilitating soldering joint is formed on the exposed portion of the lead part left unsealed with the sealing resin. Accordingly, for example, upon connecting the lead part with the implementing substrate (or printed circuit board) by soldering, the adhesiveness between the implementing substrate and the lead part can be significantly enhanced.

In the second semiconductor device according to this invention, the plated layer may be formed on a top surface of the die pad of the lead frame material as well as on a portion, connected with the bonding wire, of a top surface of the lead part of the lead frame material, and the roughened face may be formed on a portion of a top surface, a side surface and a bottom surface, in the resin sealing region of the lead frame material. According to this semiconductor device, the joining area between the circuit member and the sealing resin can be securely increased, thereby enhancing the adhesiveness between the circuit member and the sealing resin.

It is noted that the average roughness Ra described herein means an arithmetic average roughness Ra prescribed in JIS B0601 (corresponding to ISO R468).

DETAILED DESCRIPTION OF THE INVENTION

Hereinafter, several embodiments of this invention will be described with reference to the drawings. It should be noted that the drawings are schematically depicted and may include expressions different, in each thickness, ratio and/or the like, from those actually used or provided therein. That is to say, each specific thickness, length and size should be assessed appropriately in consideration of the description provided below. Additionally, it should be appreciated that the drawings may individually or independently include the same part or component depicted differently in the length and/or ratio relative to one another.

In the description provided below, an example will be discussed, in which a "lead frame material" having a desired shape (or contour) is prepared by etching or pressing a plate-like material, and a "circuit member" is produced by roughening a surface and/or forming a plated layer on the surface of the lead frame material. In the description, a surface of the lead frame or circuit member, on the side mounted onto a semiconductor chip (or on the side facing (opposed to) the semiconductor chip), will be referred to as a "top surface" while a surface opposite to the top surface will be referred to as a "bottom surface."

First Embodiment

First of all, a first embodiment of the present invention will be described with reference to FIGS. 1 to 8. Of these drawings, FIG. 1 is a top view of the lead frame material of the QEP type, and FIGS. 2 to 8 are provided for illustrating the circuit member, a manufacturing method for the circuit member and a semiconductor device including the circuit member, respectively seen from a viewpoint corresponding to a cross section taken along line A-A of FIG. 1.

Construction of the Circuit Member

The lead frame material (lead frame body, lead frame member) 1 related to this embodiment is manufactured from a rolled copper plate or rolled copper alloy plate having an elongated plate-like or coil-like shape. In more detail, the lead frame material 1 is formed, in succession, in the rolled copper plate or rolled copper-alloy plate, by etching employing photolithography technology or punching with a press using a mold (mold tool, die), or the like means. That is to say, a plurality of lead frame patterns are formed successively in the rolled copper plate or rolled copper-alloy plate having the elongated plate-like or coil-like shape. It is noted that a single or one unit of the lead frame patterns is depicted in FIG. 1. In FIG. 1, a resin sealing region 9 that will be sealed by a sealing resin in a process of manufacturing the semiconductor device by using the lead frame material 1 shown in FIG. 1 is expressed by a dotted line.

Figure 1:
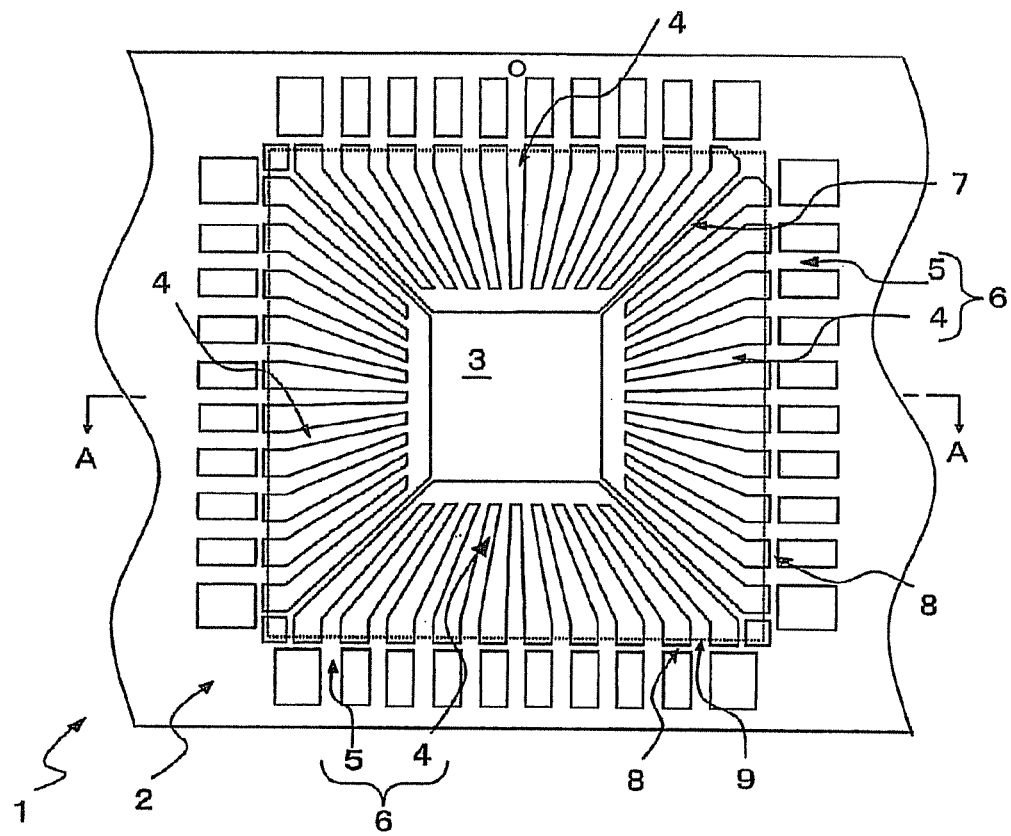
FIG. 1 is a top view showing a lead frame material included in a circuit member of the QFP type of a first embodiment and a second embodiment.

As shown in FIG. 1, the lead frame material 1 includes a die pad 3 adapted for mounting thereon a semiconductor chip 30 placed in a substantially central position, and a lead part 6 arranged to surround the die pad 3 from all or four sides. The lead part 6 is configured to electrically connect the semiconductor chip 30 with an external circuit. The lead part 6 includes a plurality of lead line parts (or lead wiring portions) each extending from a portion in the vicinity of the die pad 3 to the outside of the resin sealing region 9. The lead line parts include internal leads 4 positioned inside the resin sealing region 9 and external leads 5 positioned outside the resin sealing region 9. The plurality of lead line parts is arranged with a predetermined gap relative to one another. The die pad 3 is supported by an outer frame 2 through tie bars 7. Each lead line part is supported by the outer frame 2 at a portion of each external lead 5. In addition, each lead line part is connected with each adjacent lead line part at the portion of each external lead 5 via a dam bar 8. It is noted that a terminal portion of each external lead 5 (i.e., an end portion thereof on the side farther from the die pad 3), each tie bar 7 outside the resin sealing region 9, each dam bar 8 and the outer frame 2 will be cut and removed after a resin sealing step in the manufacturing process for the semiconductor device 35.

Figure 4:
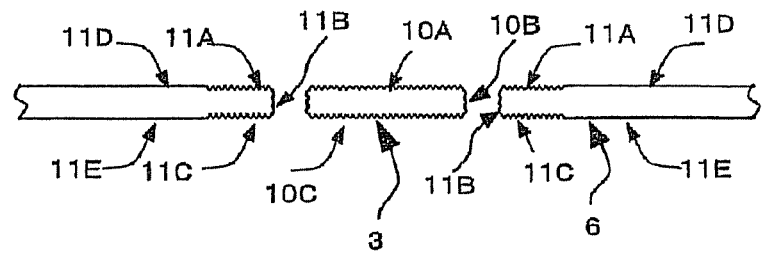
FIG. 4 is a diagram for illustrating the manufacturing method of the circuit member of the first embodiment.

As shown in FIG. 4, roughened faces 10A, 10B, 10C, 11A, 11B, 11C are formed on a top surface, side surfaces and a bottom surface of the die pad 3 of the lead frame material 1 as well as on a top surface, side surfaces and a bottom surface of the lead part 6 inside the resin sealing region 9, by using a micro-etching liquid mainly containing hydrogen peroxide and sulfuric acid. On the other hand, there is no roughened face formed on a surface portion outside the resin sealing region 9 of the lead frame material 1. Accordingly, the surface portion outside the resin sealing region 9 of the lead frame material 1 is a flat and smooth face having an average roughness Ra less than the average roughness Ra of the roughened faces 10a, 10b, 10C, 11A, 11B, 11C.

Both of the average roughness Ra of the roughened faces 10A, 10B, 10C of the die pad 3 in the resin sealing region 9 and the average roughness Ra of the roughened faces 11A, 11B, 11C of the lead part 6 in the resin sealing region 9 is set at 0.3 μm or greater (i.e., Ra≧0.3 μm). A surface profile of each roughened face 10A, 10B, 10C, 11A, 11B, 11C is a fine concavo-convex face including fine pointed needle-like projections. Such roughened faces 10A, 10B, 10C, 11A, 11B, 11C can serve to enhance adhesion strength between the circuit member 20 and the sealing resin 33. However, if the average roughness Ra is less than 0.3 μm, the adhesion strength between the circuit member 20 and the sealing resin 33 will be insufficient, leading to deterioration of the reliability of the semiconductor device 35. Meanwhile, it is also preferred to set the average roughness Ra of each roughened face 10A, 10B, 10C, 11A, 11B, 11C at 0.6 μm or less.

The top surface 11D and bottom surface 11E of the lead part 6 outside the resin sealing region 9 are flat and smooth faces. If these faces are also roughened, it would be difficult to keep appropriate adhesiveness between the circuit member 20 and a resin sealing mold (or jig (tolling)) upon the resin sealing step in the manufacturing process for the semiconductor device. For instance, if the adhesiveness between the circuit member 20 and the resin sealing mold (or jig (tolling)) could not be kept appropriately, a resin bar or leakage of the resin would be generated. Additionally, adhesiveness at each solder joint portion (soldering portion) between the external leads 5 and an implementing substrate (or printed circuit board) (not shown) would be degraded when the semiconductor device 35 is mounted onto the implementing substrate.

For such reasons, in this embodiment, the regions to be roughened are limited into the resin sealing region 9.

Figure 5:
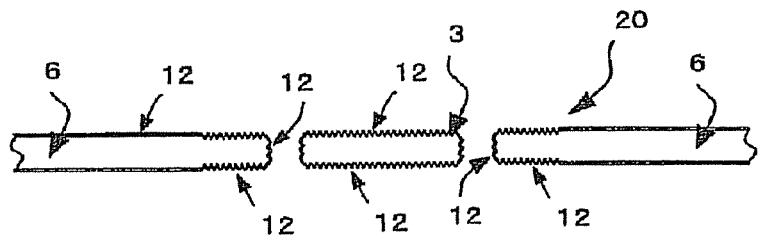
FIG. 5 is a diagram for illustrating the manufacturing method of the circuit member of the first embodiment.

As shown in FIG. 5, a plated layer 12 is formed on the whole surface of the top surface, the side surfaces and the bottom surface of the lead frame material 1. The plated layer 12 is also formed on each roughened portion 10A, 10B, 10C, 11A, 11B, 11C of the lead frame material 1. However, because the thickness of the plated layer 12 is considerably thin, the surface profile including fine pointed needle-like projections of each roughened face 10A, 10B, 10C, 11A, 11B, 11C can remain on the surface of the circuit member 20, without being collapsed, even after the formation of the plated layer 12 thereon. That is to say, the surface of the circuit member 20 will now not only exhibit an effect as the roughened faces 10A, 10B, 10C, 11A, 11B, 11C but also exhibit an effect as the plated layer 12. The plated layer 12 serves to enhance adhesiveness between the internal leads 4 of the circuit member 20 and bonding wires 32. In addition, the plated layer 12 also serves to enhance the adhesiveness at the solder joint portions between the external leads 5 of the circuit member 20 and the implementing substrate (or printed circuit board).

Figure 6:
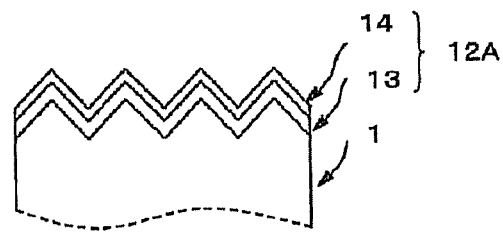
FIG. 6 is a diagram corresponding to a partially enlarged view of FIG. 5 and showing one example of a plated layer that can be formed on a surface of the lead frame material shown in FIG. 5.
Figure 7:
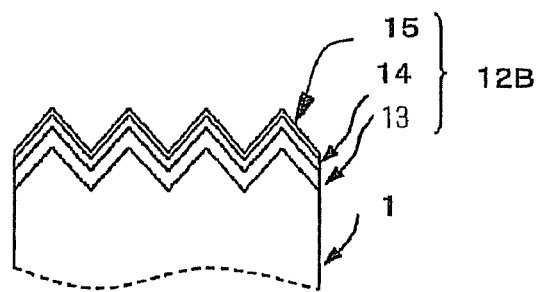
FIG. 7 is a diagram corresponding to a partially enlarged view of FIG. 5 and showing another example of the plated layer that can be foamed on the surface of the lead frame material shown in FIG. 5.
Figure 8:
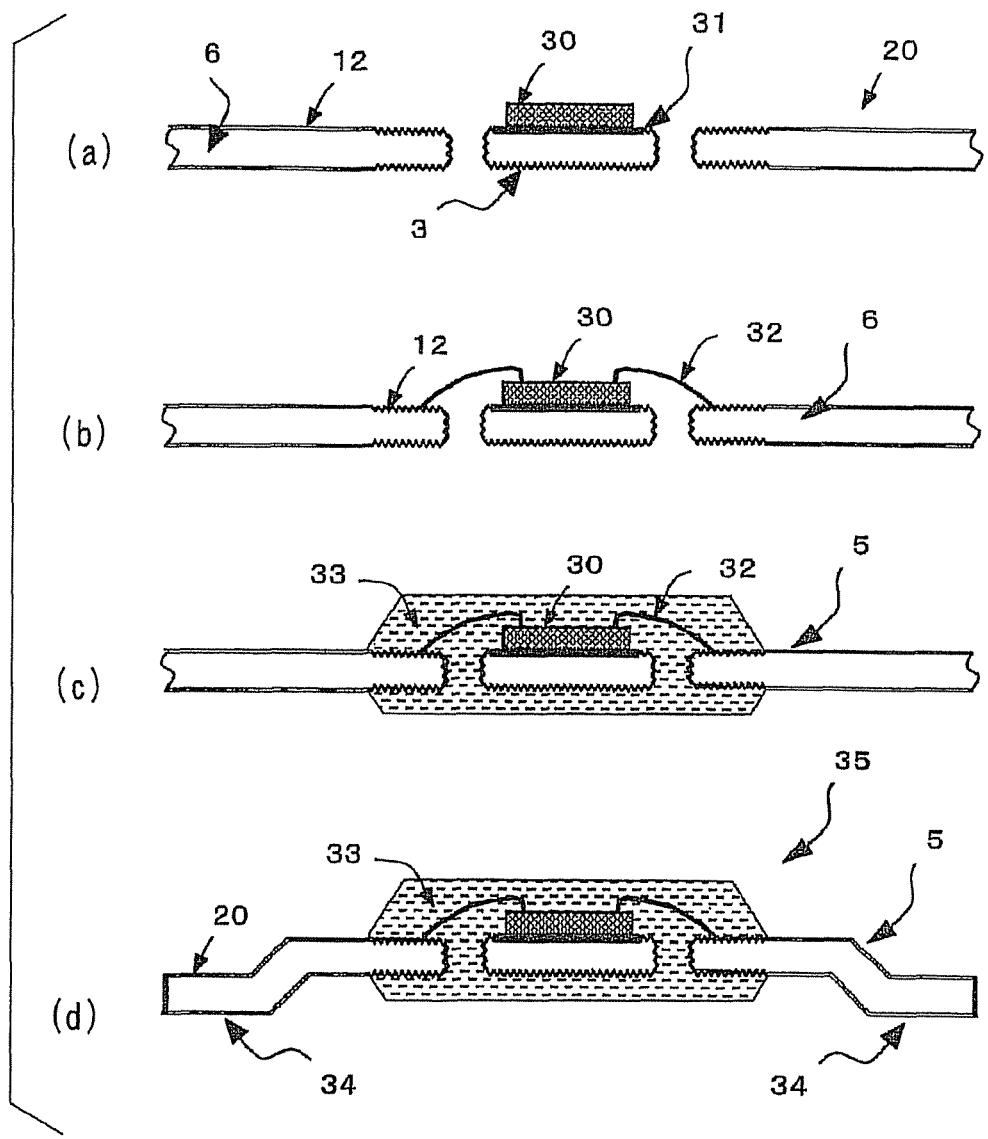
FIG. 8 is a diagram for illustrating a manufacturing method of a semiconductor device of the first embodiment.

FIGS. 6 and 7 are enlarged views respectively showing a part of the roughened face of the die pad 3 or the lead part 6 shown in FIG. 5. As shown in FIG. 6, the plated layer 12 may be a two-layer plated layer 12A formed by laminating a Ni plated layer 13 and a Pd plated layer 14 in this order, on the lead frame material 1. Otherwise, the plated layer 12 may be a three-layer plated layer 12B formed by further laminating an Au plated layer 15 on the two-layered plated layer 12A shown in FIG. 6, in other words, by laminating the Ni plated layer 13, the Pd plated layer 14 and the Au plated layer 15 in this order, on the lead frame material 1. Preferably, the thickness of the Ni plated layer 13 is within a range of from 0.2 µm to 2 µm, and more preferably from 0.5 µm to 2 µm. Preferably, the thickness of the Pd plated layer 14 is within a range of from 0.005 µm to 0.2 µm. Preferably, the thickness of the Au plated layer 15 is within a range of from 0.003 µm to 0.015 µm.

The Ni plated layer 13 serves to prevent diffusion of copper contained in the lead frame material 1 into a bonding face formed upon bonding the bonding wires 32 to the circuit member 20 in the process for manufacturing the semiconductor device 35. Accordingly, by providing such a Ni plated layer 13, the adhesiveness between the internal leads 4 and the bonding wires 32 at respective connecting portions between the internal leads 4 and the bonding wires 32 in the circuit member 20 can be enhanced. As a result, the lead part 6 can be firmly joined to the bonding wires 32. Furthermore, the Ni plated layer 13 can serve to prevent diffusion of the copper contained in the lead frame material 1 into a region to be soldered upon soldering the semiconductor device 35 to the implementing substrate (or printed circuit board). Thus, by providing such a Ni plated layer 13, the adhesiveness between the external leads 5 and each soldering portion of the implementing substrate (or printed circuit board) can be enhanced. As a result, a firmly joined relationship between the lead part 6 and the implementing substrate (or printed circuit board) can be ensured.

If the thickness of the Ni plated layer 13 is less than 0.5 µm, the effect of preventing the copper contained in the lead frame material 1 from being diffused into the bonding face would be deteriorated to some extent. In addition, if the thickness of the Ni plated layer 13 is less than 0.2 µm, the effect of preventing the copper contained in the lead frame material 1 from being diffused into the bonding face would be reduced more conspicuously. Meanwhile, if the thickness of the Ni plated layer 13 is greater than 2 µm, the roughened needle-like surface profile would be collapsed. In addition, if the thickness of the Ni plated layer 13 is greater than 2 µm, a crack would be likely to occur in such a thicker Ni plated layer 13, due to bending of each external lead 5 upon forming the external leads 5 in the process for manufacturing the semiconductor device 35. Moreover, with such increase of the thickness of the Ni plated layer 13, the time required for forming the plated layer should be significantly longer, thus leading to deterioration of the production efficiency of the circuit member 20. For these reasons, it is preferred to set the thickness of the Ni plated layer 13 within the range of from 0.2 µm to 2 µm, and more preferably from 0.5 µm to 2 µm.

With the provision of the Pd plated layer 14, the adhesiveness between the internal leads 4 and the bonding wires 32 at the respective connecting portions of the internal leads 4 of the circuit member 20 and the bonding wires 32 can be enhanced. As a result, the lead part 6 and the bonding wires 32 can be securely and firmly joined together. In addition, the provision of the Pd plated layer 14 can improve the adhesiveness at the respective solder joint portions between the external leads 5 and of the implementing substrate (or printed circuit board). As a result, a firmly joined relationship between the lead part 6 and the implementing substrate (or printed circuit board) can be ensured. If the thickness of the Pd plated layer 14 is less than 0.005 µm, the adhesiveness at the respective solder joint portions between the external leads 5 and the implementing substrate (or printed circuit board) would be degraded. Meanwhile, if the thickness of the Pd plated layer 14 is greater than 0.2 µm, the adhesion strength between the circuit member 20 and the sealing resin 33 would be deteriorated. Additionally, with further increase of the thickness of the Pd plated layer 14, the cost for the material would be raised because palladium is relatively expensive. For these reasons, it is preferred to set the thickness of the Pd plated layer 14 within the range of from 0.005 µm to 0.2 µm.

As described above, the provision of the Au plated layer 15 may be optional. However, with the provision of the Au plated layer 15, the adhesiveness between the internal leads 4 and the bonding wires 32 at the respective connecting portions of the internal leads 4 of the circuit member 20 and the bonding wires 32 can be substantially improved. Furthermore, the provision of the Au plated layer 15 can enhance the adhesiveness at the respective solder joint portions between the external leads 5 and the implementing substrate (or printed circuit board). However, if the thickness of the Au plated layer 15 exceeds 0.015 µm, the adhesion strength between the circuit member 20 and the sealing resin 33 would be lowered. Moreover, with further increase of the thickness of the Au plated layer 15, the cost for the material would be disadvantageously raised because gold is very expensive. For these reasons, it is preferred to set the thickness of the Au plated layer 15 within the range of from 0.003 µm to 0.015 µm.

In this embodiment, as shown in FIG. 1, the lead frame material 1 of the QFP type is employed. Accordingly, the circuit member 20 can be in contact with the sealing resin 33, at the top surface, side surfaces and bottom surface, in the resin sealing region 9, of its surface. Meanwhile, in the case of the circuit member of the QFN type or of the circuit member of the SON type, the bottom surface of the lead part serves as a terminal for connecting with and joining to the implementing substrate. Therefore, in this case, the joining portions between the circuit member and the sealing resin are only the top surface and side surfaces of the circuit member. Thus, in the case of the circuit member of the QFN type or of the circuit member of the SON type, the joining area between the circuit member and the sealing resin cannot be provided so wide as the circuit member of the QFP type. That is to say, the joining area between the circuit member of the QFN type or the circuit member of the SON type and the sealing resin is an approximately half of the joining area between the circuit member of the QFP type and the sealing resin, thus being significantly small. Therefore, the employment of the QFP type circuit member can ensure to provide a relatively large joining area between the circuit member and the sealing resin.

In addition, with the roughening of the portions of the surface of the circuit member 20 (or lead frame material 1) joined to the sealing resin 33, substantially improved anchor effect can be obtained, thereby further enhancing the adhesion strength between the circuit member 20 and the sealing resin 33.

Manufacturing Method for the Circuit Member

Next, the manufacturing method for the circuit member related to this embodiment will be described with reference to FIGS. 2 to 7.

Figure 2:
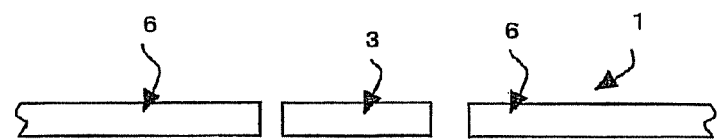
FIG. 2 is a cross section taken along line A-A of FIG. 1.
Figure 3:
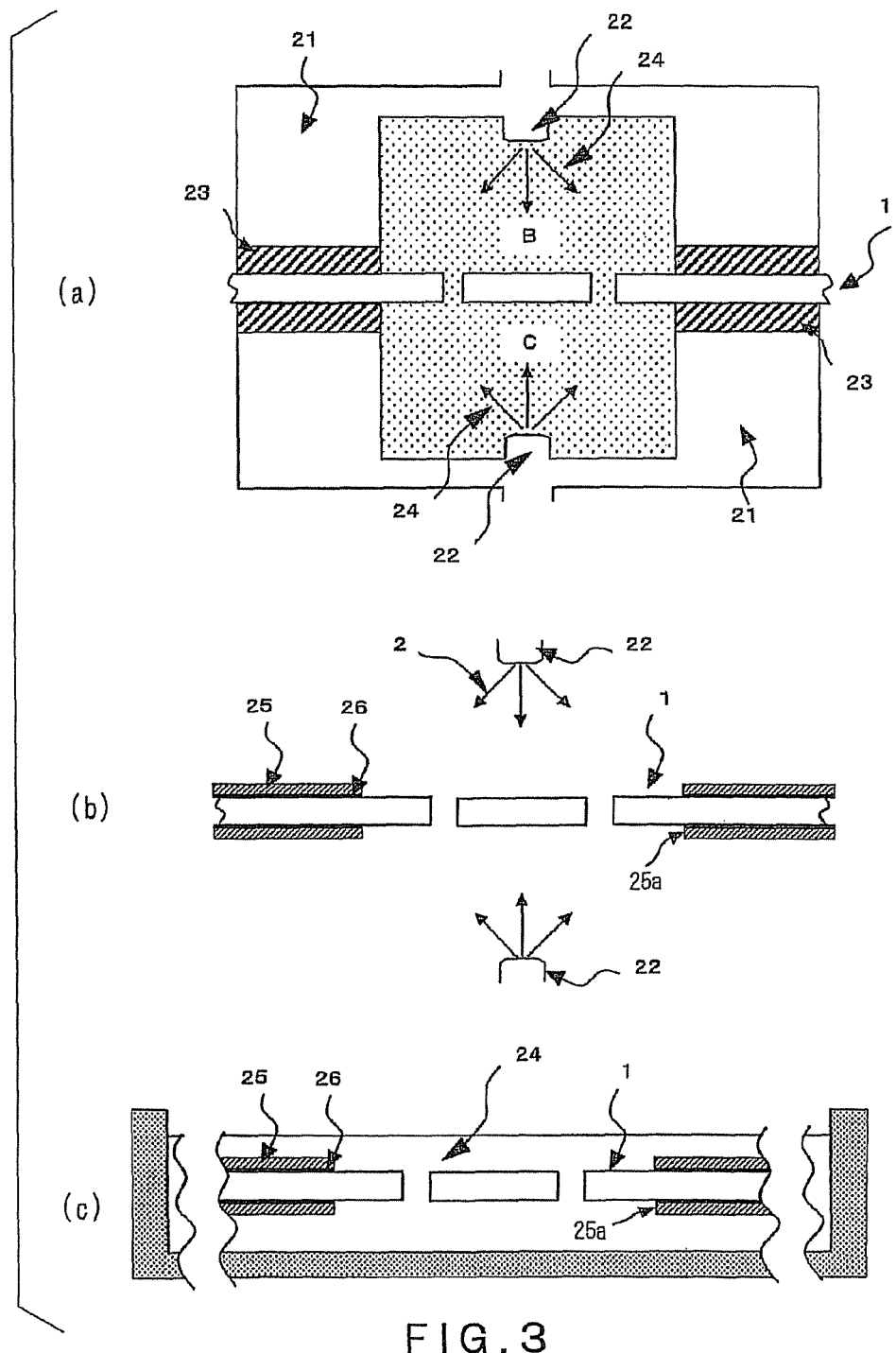
FIG. 3 is a diagram for illustrating a manufacturing method of the circuit member of the first embodiment.

In the manufacturing method related to this embodiment, as shown in FIG. 2, an etching process employing photolithography is provided to the elongated-plate-like or coil-like rolled copper plate or rolled copper-alloy plate. Otherwise, publicly known machining, such as punching with a press using a mold, is performed to the rolled copper plate or the rolled copper-alloy plate so as to form desired patterns therein. In such a manner, the lead frame material (or materials) 1, having the die pad 3, the lead part 6 and the outer frame 2 (see FIG. 1) formed therein, can be obtained. As a material for constructing the lead frame material 1, the rolled copper plate or rolled copper-alloy plate, which is excellent in the electrical conductivity, press-moldability, durability and the like and has a thickness of from 0.05 mm to 0.3 mm, can be used.

Subsequently, as shown in FIG. 3(a), the lead frame material 1 is held by a jig (tooling) 21, via packing 23, in order that the outside of the resin sealing region 9 is not contacted with a micro-etching liquid 24. As the packing 23, for example, an elastic sheet of rubber capable of masking the outside of the resin sealing region 9 of the lead frame material 1 can be used. Nozzles 22 for injecting (discharging) the micro-etching liquid 24 are arranged, above the top surface and below the bottom surface of the lead frame material 1 in the jigs 21, respectively. In this way, the micro-etching liquid 24 can be injected in directions B and C, as shown in FIG. 3(a), from the nozzles 22, respectively. As such, the roughened faces 10A, 10B, 10C, 11A, 11B, 11C can be provided to the surface of the lead frame material 1 located in the resin sealing region 9.

In an example shown in FIG. 3(a), the process for forming the roughened faces 10A, 10B, 10C, 11A, 11B, 11C includes: a step of holding the lead frame material 1 from both sides, by using the jig 21 configured to surround the resin sealing region 9 of the lead frame material 1 and then contact with a region outside the resin sealing region 9 along an outer contour of the resin sealing region 9 so as to mask the region outside the resin sealing region 9; and a step of discharging the micro-etching liquid into the jig 21, on both sides of the lead frame material 1, so as to fill the interior of the jig 21 surrounding the resin sealing region 9 of the lead frame material 1 with the micro-etching liquid.

However, the method of forming the roughening faces 10A, 10B, 10C, 11A, 11B, 11C is not limited to the method shown in FIG. 3(a). For example, as shown in FIG. 3(b), the roughened faces 10A, 10B, 10C, 11A, 11B, 11C may be formed by using protective films 25 each having an opening 25a corresponding to the outer contour of the resin sealing region 9 of the lead frame material 1. That is to say, the protective films 25, each having the opening 25a provided to expose only the resin sealing region 9 of the lead frame material 1, are first stuck onto the top surface and bottom surface of the lead frame material 1 via an adhesive layer 26, respectively. In this way, the region outside the resin sealing region 9 can be masked by such protective films 25. Thereafter, the micro-etching liquid 24 is injected (discharged, spouted) from the nozzles 22 respectively located above the top surface and below the bottom surface of the lead frame material 1. Also in such a manner, the roughened faces 10A, 10B, 10C, 11A, 11B, 11C can be formed on the surface in the resin sealing region 9 of the lead frame material 1.

That is to say, in an example shown in FIG. 3(b), the process for forming the roughened faces 10A, 10B, 10C, 11A, 11B, 11C includes: a step of sticking the protective films 25, each having the opening 25a formed to expose only the resin sealing region 9 of the lead frame 1, onto both sides of the lead frame material 1 via the adhesive layer 26, respectively; and a step of injecting the micro-etching liquid toward the inside of each opening 25a from both sides of the lead frame material 1.

Furthermore, the roughened faces 10A, 10B, 10C, 11A, 11B, 11C may also be formed in such a manner as shown in FIG. 3(c). That is to say, the protective films 25, each having the opening 25a provided to expose only the resin sealing region 9 of the lead frame 1, are first stuck onto the top surface and bottom surface of the lead frame material 1 via the adhesive layer 26, respectively. Consequently, the region outside the resin sealing region 9 can be masked by the protective films 25. Thereafter, the lead frame material 1 is immersed in the micro-etching liquid 24. In this manner, the roughened faces 10A, 10B, 10C, 11A, 11B, 11C can also be provided to the surface in the resin sealing region 9 of the lead frame material 1.

That is to say, in an example shown in FIG. 3(c), the process for forming the roughened faces 10A, 10B, 10C, 11A, 11B, 11C includes: a step of sticking the protective films 25, each having the opening 25a formed to expose only the resin sealing region 9 of the lead frame 1, onto both sides of the lead frame material 1 via the adhesive layer 26, respectively; and a step of immersing the lead frame material 1, on which the protective films 25 are stuck, into the micro-etching liquid.

The micro-etching liquid used for such a face roughening process mainly contains hydrogen peroxide and sulfuric acid and can be suitable for roughening the rolled copper plate or the rolled copper-alloy plate. For instance, by adjusting the temperature of the micro-etching liquid at 35 to 45° C. and controlling the time for the micro-etching process within a range of from 1 minute to 3 minutes, as well as by appropriately controlling the concentration and injecting pressure of the micro-etching liquid, the roughened face having the average roughness Ra of 0.3 μm or greater can be obtained. In view of the production efficiency, it is preferred to employ a shorter micro-etching time. However, if it is unduly short, the average roughness Ra of 0.3 μm or greater cannot be achieved. Meanwhile, if the micro-etching time exceeds a desired range, the production efficiency should be lowered, as well as a finished state of the roughened faces 10A, 10B, 10C, 11A, 11B, 11C would be unstable. More specifically, the surface profile once formed to have finely pointed needle-like projections would be etched further, as such having undesired dull projections. Therefore, it is preferred to set the average roughness Ra within a range of from 0.3 μm to 0.6 μm, by controlling the concentration, fatigue (freshness), temperature, injection pressure and the like of the micro-etching liquid.

With the provision of the micro-etching process described above, as shown in FIG. 4, the roughened faces 10A, 10B, 10C, 11A, 11B, 11C can be formed on the top surface, side surfaces and bottom surface in the resin sealing region 9 of the lead frame material 1. On the other hand, with the masking using the packing 23 of the jig 21 as shown in FIG. 3(a), or with the masking using the protective films 25 as shown in FIG. 3(b), the surface outside the resin sealing region 9 of the lead frame material 1 can be left as a flat and smooth face, like the faces 11D, 11E.

Subsequently, as shown in FIG. 5, the plated layer 12 is formed on the whole surface of the lead frame material 1 on which the roughened faces 10A, 10B, 10C, 11A, 11B, 11C have been partially formed. In this case, as shown in FIG. 6, the plated layer 12 formed on the surface may be the two-layer plated layer 12A formed by laminating the Ni plated layer 13 and the Pd plated layer 14 in this order, onto the lead frame material 1. Alternatively, as shown in FIG. 7, the plated layer 12 formed on the surface may be the three-layer plated layer 12B formed by laminating the Au plated layer 15 onto the two-layer plated layer 12A shown in FIG. 6, in other words, by laminating the Ni plated layer 13, the Pd plated layer 14 and the Au plated layer 15 in this order, onto the lead frame material 1. As the method for forming the plated layer 12, a publicly known method, for example, an electrolytic plating method, non-electrolytic plating method or the like can be used. In this case, the growth of each plated layer is controlled, such that the thickness of the Ni plated layer 13 will be within the range of from 0.2 μm to 2 μm, more preferably within the range of from 0.5 μm to 2 μm, such that the thickness of the Pd plated layer 14 will be within the range of from 0.005 μm to 0.2 μm, and such that the thickness of the Au plated layer 15 will be within the range of from 0.003 μm to 0.015 μm.

In the above stated manner, the circuit member 20 that can substantially enhance the adhesion strength between this circuit member 20 and the sealing resin 33 can be manufactured.

Semiconductor Device

Next, the manufacturing method for the semiconductor device 35 and the construction of the semiconductor device 35 will be described, with reference to FIGS. 8(a) to 8(d).

As shown in FIG. 8(a), the semiconductor chip 30 is mounted on the top surface of the die pad 3 of the circuit member 20 produced by the manufacturing method described above, via die bonding paste 31. The die bonding paste 31 has adhesive properties and serves to adhere and fix the semiconductor chip 30 onto the die pad 3.

Thereafter, as shown in FIG. 8(b), each electrode of the semiconductor chip 30 and each lead line part (lead wiring portion) of the lead part 6 of the circuit member corresponding to the electrode are electrically connected each other by using each bonding wire 32. Each bonding wire 32 is formed from a material of a very low electrical resistance because its diameter is as extremely thin as several ten microns. For instance, each bonding wire 32 is formed from a fine gold wire. In the circuit member 20 related to this embodiment, the plated layers 12 are provided over the surfaces of the internal leads 4, through which surfaces of the internal leads 4 the bonding wires 32 are respectively connected to the lead part 6. Accordingly, the bonding wires 32 can be firmly joined to the lead part 6.

Subsequently, a space just outside the resin sealing region 9 of the circuit member 20 is interposed and surrounded, from above and below, by a resin sealing mold (not shown). Then, the sealing resin 33 consisting of, for example, an epoxy resin, is poured into the resin sealing mold. Thereafter, the poured sealing resin 33 is cured. Consequently, as shown in FIG. 8(c), the resin sealing region 9 of the circuit member 20, semiconductor chip 30 and bonding wires 32 are packed or enveloped in the sealing resin 33. Meanwhile, the external leads 5 and outer frame 2 are not sealed by the sealing resin 33 and thus left exposed. As described above, the outside of the resin sealing region 9 of the circuit member 20 (or lead frame material 1) is formed as the flat and smooth face. Therefore, the resin sealing mold can be closely adhered to the surface outside the resin sealing region 9 of the circuit member 20 (or lead frame material 1). This can prevent the sealing resin 33 from flowing out through any gap between the surface of the resin sealing region 9 of the circuit member 20 (or lead frame material 1) and the resin sealing mold, thereby preventing formation of the resin bar or leakage of the resin.

Thereafter, the tie bars 7 remaining outside the resin sealing region 9 are removed. As a result, the die pad 3 can be separated from the outer frame 2. Similarly, the dam bars 8 located between the respective lead line parts of the lead part 6 are removed. Thus, the plurality of lead line parts (or lead wiring portions) of the lead part 6 are brought into a non-electrically-connected state relative to one another. Furthermore, each external lead 5 of the lead part 6 is cut off at its terminal portion farther from the sealing resin 33. Consequently, the lead part 6 is separated from the outer frame 2. After these processes, the die pad 3 and the lead part 6 are virtually separated from each other, while they are still integrally held by the non-electrically-conductive sealing resin 33. In this way, as shown in FIG. 8(d), the semiconductor device 35 including the parts (i.e., the portion including the die pad 3, internal leads 4, semiconductor chip 30 and boding wires 32) sealed by the sealing resin 33 and the external leads 5 each extending outward from the sealing resin 33 can be obtained. Finally, the semiconductor device 35 of this embodiment is configured to include joining portions 34 provided at respective bottom surfaces of the terminal portions of the external leads 5. As such, the semiconductor device 35 can be electrically joined to the implementing substrate (or printed circuit board) (not shown), by soldering, via the respective joining portions 34.

In this semiconductor device 35, a significantly widened joining area can be achieved between the circuit member 20 and the sealing resin 33. Each joining face between the circuit member 20 and the sealing resin 33 is formed into the roughened face (having a concavo-convex surface) including finely pointed needle-like projections. Additionally, the plated layer 12 is formed on each roughened face 10A, 10B, 10C, 11A, 11B, 11C. With such means or measures, the adhesiveness between the circuit member 20 and the sealing resin 33 as well as the adhesiveness between the bonding wires 32 and the lead part 6 of the circuit member 20 can be significantly improved. Consequently, the semiconductor device 35 according to this embodiment can exhibit excellent durability against temperature change and/or vibration. From these features, the semiconductor device 35 in this embodiment can be considered to ensure significantly higher reliability.

Second Embodiment

Next a second embodiment according to the present invention will be described with reference to FIGS. 9 to 15. FIGS. 9 to 15 are provided for illustrating the circuit member, the manufacturing method for the circuit member and the semiconductor device including the circuit member, respectively related to the second embodiment and seen from a viewpoint corresponding to the cross section taken along line A-A of FIG. 1. It is noted that in the second embodiment shown in FIGS. 9 to 15, like parts in the first embodiment will be designated by like reference numerals, and repeated description thereof will be omitted below.

Construction of the Circuit Member

Figure 9:
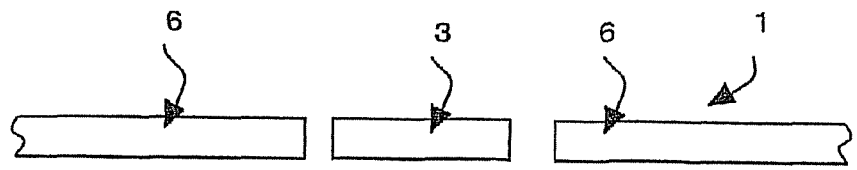
FIG. 9 is a diagram corresponding to FIG. 2 and showing the lead frame material included in the circuit member of the second embodiment.

As shown in FIG. 9, the lead frame material (lead frame body, lead frame member) 1 related to the second embodiment has substantially the same construction as that of the first embodiment shown in FIG. 1. Therefore, the description about the lead frame material 1 of the second embodiment will now be omitted.

Figure 10:
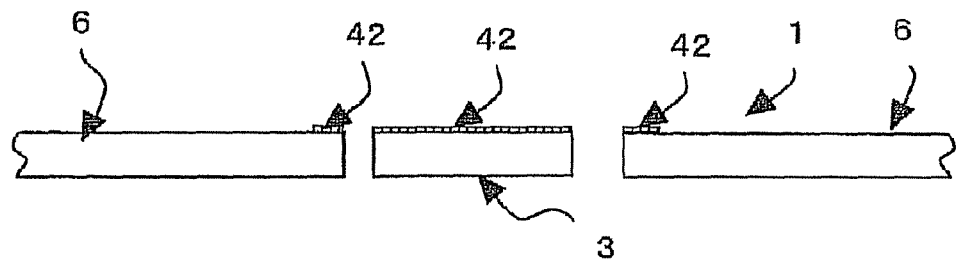
FIG. 10 is a diagram for illustrating the manufacturing method of the circuit member of the second embodiment.
Figure 12:
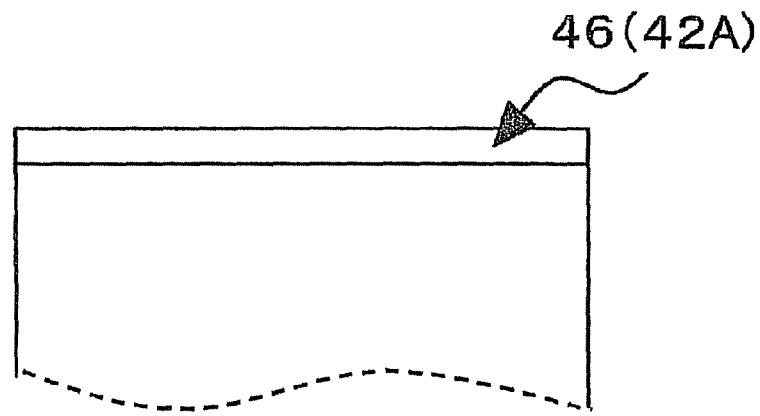
FIG. 12 is a diagram corresponding to a partially enlarged view of FIG. 11 and showing one example of a plated layer that can be formed on a surface of the lead frame material shown in FIG. 11.
Figure 13:
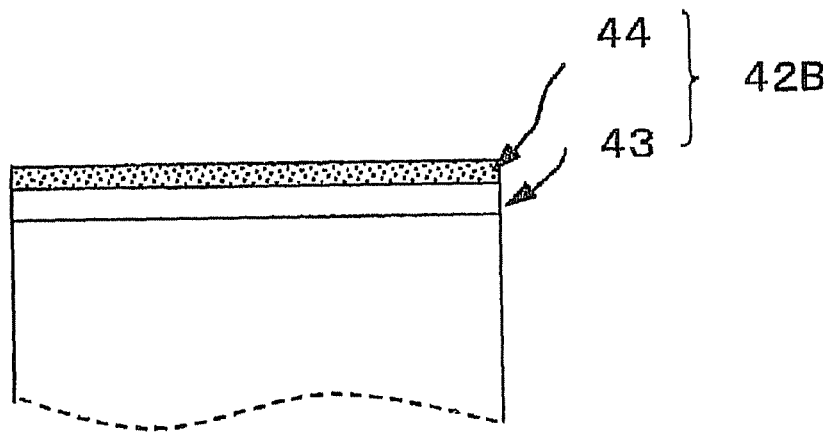
FIG. 13 is a diagram corresponding to a partially enlarged view of FIG. 11 and showing another example of the plated layer that can be formed on the surface of the lead frame material shown in FIG. 11.
Figure 14:
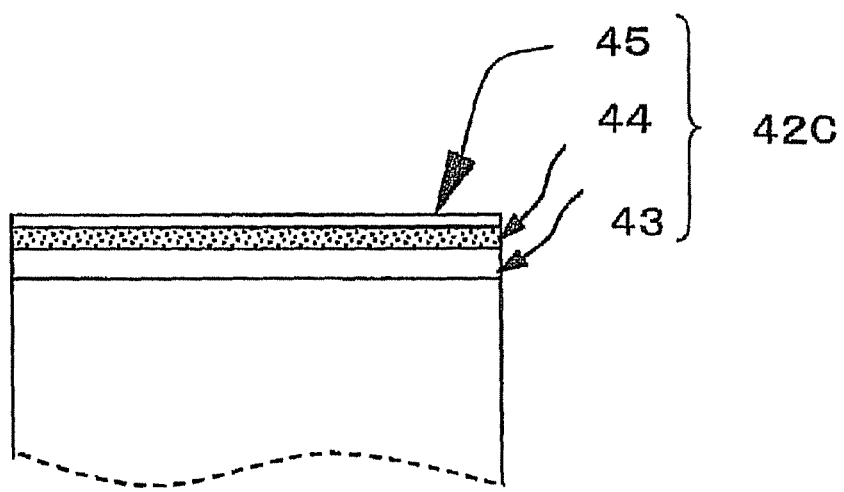
FIG. 14 is a diagram corresponding to a partially enlarged view of FIG. 11 and showing still another example of the plated layer that can be formed on the surface of the lead frame material shown in FIG. 11.
Figure 15:
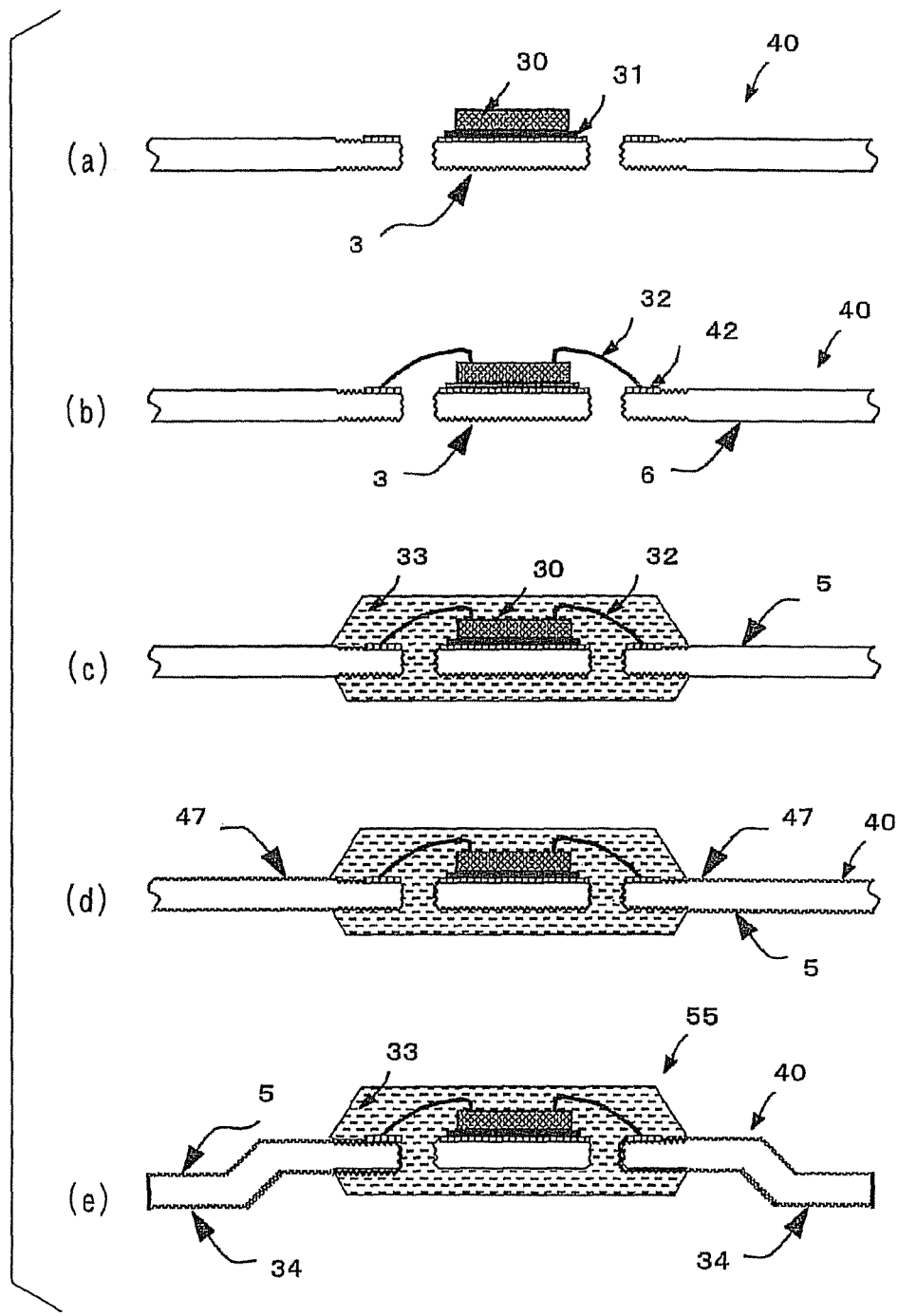
FIG. 15 is a diagram corresponding to FIG. 8 and illustrating a manufacturing method of the semiconductor device of the second embodiment.

As shown in FIG. 10, a plated layer 42 is formed on the top surface of the die pad 3 of the lead frame material 1 as well as on the top surface of the bonding wire connecting portion of the lead part 6 at which the bonding wire is connected to the lead part 6. As shown in FIG. 12, the plated layer 42 may be a one-layer plated layer 42A composed of an Ag plated layer 46. Alternatively, as shown in FIG. 13, the plated layer 42 may be a two-layer plated layer 42B formed by laminating a Ni plated layer 43 and a Pd plated layer 44. Furthermore, as shown in FIG. 14, the plated layer 42 may be a three-layer plated layer 42C formed by laminating an Au plated layer 45 on the plated layer 42B shown in FIG. 13, in other words, by laminating the Ni plated layer 43, the Pd plated layer 44 and the Au plated layer 45 in this order. Preferably, the thickness of the Ag plated layer 46 is within a range of from 1.5 µm to 12 µm. Preferably, the thickness of the Ni plated layer 43 is within a range of from 0.2 µm to 2 µm, and more preferably 0.5 µm to 2 µm. Preferably, the thickness of the Pd plated layer 44 is within a range of from 0.005 µm to 0.2 µm. Preferably, the thickness of the Au plated layer 45 is within a range of from 0.003 µm to 0.015 µm.

With the provision of the Au plated layer 45, the adhesiveness between the internal leads 4 and the bonding wires 32 in the respective bonding wire connecting portion of the internal leads 4 of the circuit member 40 can be enhanced. If the thickness of the Ag plated layer 46 is significantly thinner than the range described above, the adhesiveness between the internal leads 4 and the bonding wires 32 would be degraded. Meanwhile, if the thickness of the Ag plated layer 46 is unduly greater, the material cost would be disadvantageously increased because silver is quite expensive. Besides, such an unduly increased thickness of the Ag plated layer 46 would make the time required for the plating unnecessarily longer, thus deteriorating the production efficiency. Therefore, it is preferred to set the thickness of the Ag plated layer 46 within the range of from 1.5 µm to 12 µm. Furthermore, from our experiments, it was found that the thickness of the Ag plated layer 46 set within a range of from 2 µm to 6 µm is more preferable, in regard to the adhesiveness between the bonding wires 32 and the internal leads 4, stability of quality of the circuit member 40 and cost for the material.

The Ni plated layer 43 serves to prevent the copper contained in the lead frame material 1 from being diffused into a bonding face formed upon bonding the bonding wires 32 to the circuit member 40 in the process for manufacturing the semiconductor device 55. Accordingly, with the provision of the Ni plated layer 43, the adhesiveness between the internal leads 4 and the bonding wires 32 in the connection portion between the internal leads 4 of the circuit member 40 and the bonding wires 32 can be enhanced. As a result, firm joining between the lead part 6 and the bonding wires 32 can be ensured. If the thickness of the Ni plated layer 43 is less than 0.5 µm, the effect of preventing the copper contained in the lead frame material 1 from being diffused into the bonding face would be slightly lowered. If the thickness of the Ni plated layer 43 is less than 0.2 µm, the effect of preventing the copper contained in the lead frame material 1 from being diffused into the bonding face would be further reduced. However, if the thickness of the Ni plated layer 43 is increased greater than the above range, the time required for the plating would be unduly longer, thus degrading the production efficiency of the circuit member 40. From these reasons, it is preferred to set the thickness of the Ni plated layer 13 within the range of from 0.2 µm to 2 µm, more preferably from 0.5 µm to 2 µm.

With the provision of the Pd plated layer 44, the adhesiveness between the internal leads 4 and the bonding wires 32 in the connecting portion between the internal leads 4 of the circuit member 40 and the lead line parts 32 can be enhanced. Consequently, the lead part 6 and the bonding wires 32 can be firmly joined together. However, if the thickness of the Pd plated layer is less than 0.005 µm, the adhesiveness between the internal leads 4 and the bonding wires 32 would be lowered. Contrary, if the thickness of the Pd plated layer 44 is greater than 0.2 µm, the adhesion strength between the circuit member 40 and the sealing resin 33 would be degraded. Moreover, if the thickness of the Pd plated layer 44 is further increased, the material cost should be increased because palladium is a very expensive material. From these reasons, it is preferred to set the thickness of the Pd plated layer 44 within the range of from 0.005 µm to 0.2 µm.

As described above, the Au plated layer 45 may be optionally provided. However, with the provision of the Au plated layer 45, the adhesiveness between the internal leads 4 and the bonding wires 32 at the connecting portion of the internal leads 4 of the circuit member 40 and the bonding wires 32 can be enhanced. However, if the thickness of the Au plated layer 45 is greater than 0.015 µm, the adhesion strength between the circuit member 40 and the sealing resin 33 would be lowered. Moreover, if the thickness of the Au plated layer 45 is further increased, the cost for the material would be unduly raised because gold is very expensive. For these reasons, it is preferred to set the thickness of the Au plated layer 45 within the range of from 0.003 µm to 0.015 µm.

Figure 11:
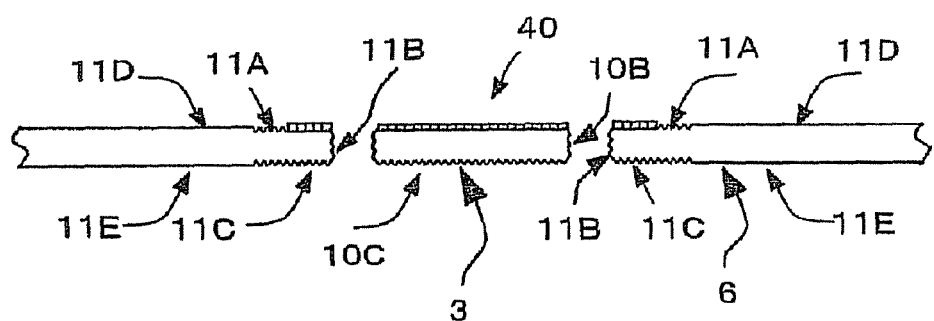
FIG. 11 is a diagram for illustrating the manufacturing method of the circuit member of the second embodiment.

In addition, as shown in FIG. 11, the roughened faces are formed on the side surfaces 10B and bottom surface 10C of the die pad of the circuit member 40. Besides, the roughened faces are also formed on the portion 11A of the top surface of the lead part 6 of the circuit member 40 in the resin sealing region 9, on which portion 11A the plated layer 42 is not formed, as well as on the side surfaces 11B and bottom surface 11C of the lead part 6 in the resin sealing region 9. Meanwhile, the roughened face is not formed on the surface outside the resign sealing region 9 of the circuit member 40 and on the plated layer 42 in the resin sealing region 9, as such these portions are left as flat and smooth faces. The roughened faces 10B, 10C of the die pad 3 in the resin sealing region 9 and the roughened faces 11A, 11B, 11C of the lead part 6 in the resin sealing region 9 are formed to have the average roughness Ra of 0.3 µm or greater, respectively. The surface profile of each roughened face 10B, 10C, 11A, 11B, 11C is a concavo-convex face having finely pointed needle-like projections. With such roughened faces 10B, 10C, 11A, 11B, 11C, the joining area between the circuit member 40 and the sealing resin 33 can be securely widened, as such improving the adhesion strength between the circuit member 40 and the sealing resin 33. However, if the average roughness Ra is less than 0.3 µm, the adhesion strength between the circuit member 40 and the sealing resin 33 would be insufficient, leading to degradation of the reliability of the semiconductor device 55. Accordingly, it is preferred to set the average roughness Ra of each roughened face 10B, 10C, 11A, 11B, 11C at 0.3 µm or greater. In addition, as with the first embodiment, it is preferred to set the average roughness Ra of each roughened face 10B, 10C, 11A, 11B, 11C at 0.6 µm or less.

In the circuit member 40 of this embodiment, the joining area between the circuit member 40 and the sealing resin 33 is less than that of the first embodiment. However, since the bonding wire connecting portion of the internal leads 4 is a flat and smooth face, the adhesiveness between the bonding wires 32 and the internal leads 4 in the bonding wire connecting portion can be securely enhanced. In addition, because the QFP type lead frame material is used as the lead frame material 1 as with the first embodiment, the joining area between the circuit member 40 and the sealing resin 33 can be significantly increased. Furthermore, with roughening of the faces for joining between the circuit member 40 and the sealing resin 33, sufficient anchor effect can be obtained, thus improving the adhesion strength between the circuit member 40 and the sealing resin 33.

Manufacturing Method for the Circuit Member)

Next, the manufacturing method for the circuit member 40 related to this embodiment will be described with reference to FIGS. 9 to 14.

First, in the manufacturing method related to this embodiment, the lead frame material 1 is prepared, as shown in FIG. 9, in the same manner as described in the above first embodiment.

Subsequently, as shown in FIG. 10, the plated layer 42 is formed on the top surface of the die pad 3 of the prepared lead frame material 1 as well as on the top surface of the bonding wire connecting portion of the lead part 6. As the plated layer 42, the one-layer plated layer 42A composed of the Ag plated layer 46 may be formed as shown in FIG. 12. Alternatively, as the plated layer 42, the two-layer plated layer 42B formed by laminating the Ni plated layer 43 and the Pd plated layer 44 in this order may be provided as shown in FIG. 13. Otherwise, as the plated layer 42, the three-layer plated layer 42C formed by laminating the Au plated layer 45 onto the two-layer plated layer 42B shown in FIG. 13, in other wards, by laminating the Ni plated layer 43, the Pd plated layer 44 and the Au plated layer 45 in this order, may be provided as shown in FIG. 14. As the method for forming the plated layer 42, a publicly known method, for example, an electrolytic plating method, non-electrolytic plating method or the like can be used. In this case, the growth of each plated layer is controlled, such that the thickness of the Ag plated layer 46 will be within the range of from 1.5 μm to 12 μm, more preferably within the range of from 2 μm to 6 μm, such that the thickness of the Ni plated layer 43 will be within the range of from 0.2 μm to 2 μm, more preferably within the range of from 0.5 μm to 2 μm, such that the thickness of the Pd plated layer 44 will be within the range of from 0.005 μm to 0.2 μm, and such that the thickness of the Au plated layer 45 will be within the range of from 0.003 μM to 0.015 μM.

Thereafter, as shown in FIG. 11, the roughened faces are formed on the side surfaces 10B and bottom surface 10C of the die pad 3 of the circuit member 40. In addition, the roughened faces are also formed on the portion of the top surface in the resin sealing region 9 of the lead part 6, on which no plated layer 42 is formed, as well as on the side surfaces 11B and bottom surface 11C in the resin sealing region 9 of the lead part 6. This partial formation of the roughened faces can be achieved by the method of using the jig (tooling) 21 (see FIG. 3(a)) or by the method of using the protective films (see FIG. 3(b) or FIG. 3(c)), as described in the first embodiment. A value of the average roughness Ra of each roughened face 10B, 10C, 11A, 11B, 11C and conditions for the micro-etching can be set similarly to the first embodiment. It is noted that the surface of each plated layer 42 is not roughened and still left as the flat and smooth face even after the micro-etching process is provided thereto.

In this way, the circuit member 40 that can enhance the adhesion strength between this circuit member 40 and the sealing resin 33 can be manufactured.

Semiconductor Device

Next, the manufacturing method for the semiconductor device 55 and the construction of the semiconductor device will be described with reference to FIGS. 15(a) to 15(e).

As shown in FIG. 15(a), the semiconductor chip 30 is mounted on the top surface of the die pad 3 of the circuit member 40 produced by the aforementioned manufacturing method of this embodiment, via die bonding paste 31, in the same manner as in the first embodiment.

Thereafter, as shown in FIG. 15(b), each electrode of the semiconductor chip 30 and each lead line part of the lead part 6 of the circuit member 40 corresponding to the electrode are electrically connected together by using each bonding wire 32. The plated layer 42 is formed on a connecting face of the internal leads 4 of the circuit member 40 related to this embodiment through which the bonding wires 32 and the internal leads 4 of lead parts connected to each other. In this case, the connecting surface of the internal leads 4 relative to the bonding wires 32 is left as a flat and smooth face. Therefore, the adhesiveness between the bonding wires 32 and the lead part 6 can be significantly enhanced.

Subsequently, as in the case of the first embodiment, a resin sealing mold (not shown) is prepared, and the sealing resin 33 is poured into the resin sealing mold. Thereafter, the poured sealing resin 33 is cured. Consequently, as shown in FIG. 15(c), the resin sealing region 9 of the circuit member 40, semiconductor chip 30 and bonding wires 32 are surrounded and enveloped in the sealing resin 33. Meanwhile, the external leads 5 and outer frame 2 are not sealed by the sealing resin 33 and thus left exposed.

Thereafter, as shown in FIG. 15(d), a solder plated layer for soldering joint 47 is formed on a portion of the exposed external leads 5. With the formation of the solder plated layer (solder plating layer) 47, a soldering process for mounting the semiconductor device 55 onto the implementing substrate (or printed circuit board) (not shown) can be facilitated, thus further enhancing the adhesiveness between the semiconductor device and the implementing substrate. However, if the thickness of the for facilitating soldering joint 47 is not sufficient, wettability (adherability) of the solder would be deteriorated, leading to degradation of the adhesion strength relative to the implementing substrate. Contrary, if the thickness of the solder plated layer 47 is unduly increased, the time required for forming the solder plated layer would be excessively longer, as such deteriorating the production efficiency. In addition, such an unduly increased thickness of the solder plated layer 47 should raise the cost for the material. From these reasons, it is preferred to set the thickness of the solder plated layer 47 within a range from 5 μm to 15 μm.

Thereafter, the tie bars 7 remaining outside the resin sealing region 9 are removed. As a result, the die pad 3 can be separated from the outer frame 2. Similarly, the dam bars 8 located between the respective lead line parts of the lead part 6 are removed. Thus, the plurality of lead line parts (lead wiring portions) of the lead part 6 is brought into a non-electrically-connected state relative to one another. Furthermore, each external lead 5 of the lead part 6 is cut off at its terminal portion farther from the sealing resin 33. Consequently, the lead part 6 is separated from the outer frame 2. After these processes, the die pad 3 and the lead part 6 are virtually separated from each other. However, they are still integrally held by the non-electrically-conductive sealing resin 33. In this way, as shown in FIG. 15(e), the semiconductor device 55 including the parts (i.e., the portion including the die pad 3, internal leads 4, semiconductor chip 30 and boding wires 32) sealed by the sealing resin 33 and the external leads 5 extending outward from the sealing resin 33 can be obtained. Eventually, the semiconductor device 55 of this embodiment is configured to include joining portions 34 provided at respective bottom surfaces of the terminal portions of the external leads 5 on which the solder plated layer 47 is formed. As such, the semiconductor device 35 can be electrically joined to the implementing substrate (or printed circuit board) (not shown), by soldering, via the respective joining portions 34.

In this semiconductor device 55, the joining area between the circuit member 40 and the sealing resin 33 can be significantly widened. Each joining face of the circuit member 40 relative to the sealing resin 33 is the roughened face (having a concavo-convex surface) including finely pointed needle-like projections. Additionally, the plated layer 42 is formed on the portion (or bonding connecting portion) in which the lead part 6 and the bonding wires 32 are bonded together. From these features, the adhesiveness between the circuit member 40 and the sealing resin 33 as well as the adhesiveness between the bonding wires 32 and the lead part 6 of the circuit member 40 can be significantly enhanced. Accordingly, the semiconductor device 55 of this embodiment can exhibit excellent durability against temperature change and/or vibration. In view of these points, the semiconductor device 55 in this embodiment can be considered to secure higher reliability.

Figure 16:
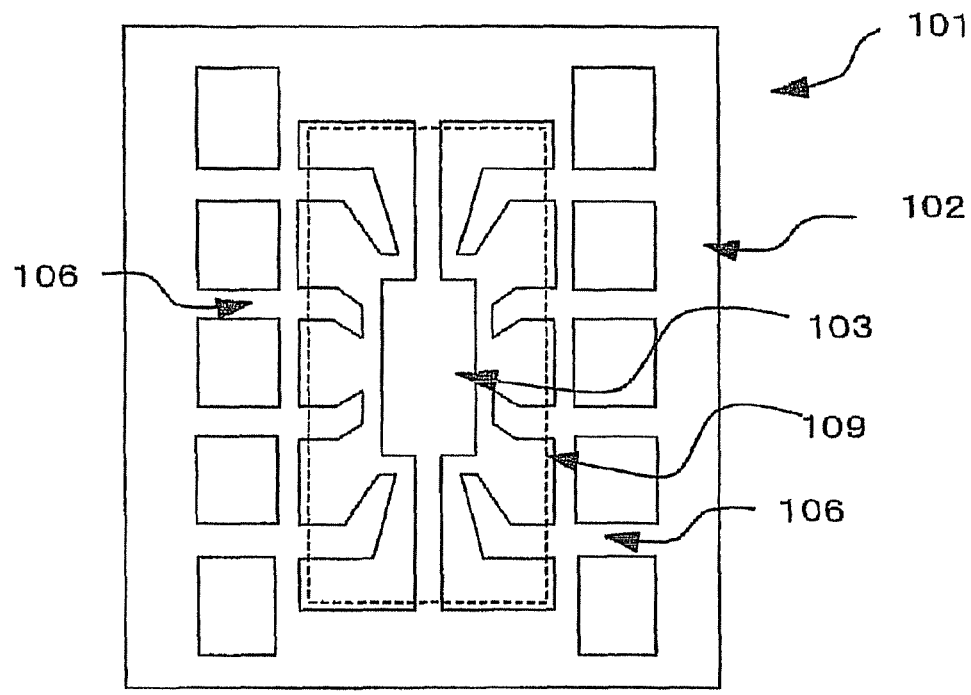
FIG. 16 is a diagram corresponding to FIG. 1 and showing of a top view of a lead frame material of the SOP type.

In the first and second embodiments described above, a case, in which the lead frame material 1 of the QFP type as shown in FIG. 1 is used as the lead frame material, has been discussed. However, the lead frame material is not limited to this type. For instance, a lead frame material 101 of the SOP type as shown in FIG. 16 can also be used herein. In such a case, the same effect as described above can also be obtained. For example, the circuit member that can securely enhance the adhesiveness between the sealing resin and the circuit member and/or the semiconductor device that can exhibit significantly higher reliability can be provided. Not limited to the QFP or SOP type, a lead frame material (read frame body, lead frame member) that is configured to be incorporated in the semiconductor device such that the sealing resin 33 seals therein not only the top surface of the circuit member but also its bottom surface, together with the semiconductor chip 30 and bonding wires 32, may also be employed. Even in such a case, the same effect as described above, for example, an effect of providing the circuit member that can securely enhance the adhesiveness between the sealing resin and the circuit member and/or providing the semiconductor device that can exhibit higher reliability, can also be obtained.

Preparation of Samples and Comparison of Properties

In order to check validity of the above face roughening process, comparison of the joining strength was conducted, with respect to a difference between the case in which the face roughening process was performed and the case in which the face roughening process was not performed. A process and a result of this comparison will be described below.

A first test piece and a second test piece, both subjected to the face roughening process as well as the plating process, were prepared. In addition, a comparative piece which was subjected to only the plating process was prepared. First, each method of preparing the first test piece, second test piece and comparative piece will be described.

First, copper-alloy plates used as raw materials were prepared. For the first test piece and comparative piece, an alloy plate MF 202 (trade name) produced by Mitsubishi Denki Meteks Co., Ltd. was used. For the second test piece, an alloy plate EFTEC64T (trade name) produced by Furukawa Denki Kogyo Co. Ltd. was used. Either of the prepared copper-alloy plates had a thickness of 0.125 mm.

With respect to the first test pieces and the second test pieces, the micro-etching process was provided to each copper-alloy plate by immersing it in the micro-etching liquid. In this case, the micro-etching liquid mainly containing hydrogen peroxide and sulfuric acid was used. The micro-etching process was performed under conditions of a micro-etching liquid temperature of 40° C. and an etching time of 1.5 minutes. As a result, in either of the first test pieces and the second test pieces, an average etching depth was 2.0 µm. What is meant by the "average etching depth" is an average value of depth or thickness etched (engraved) off by the micro-etching liquid in the surface of the copper-alloy plate as the raw material.

Thereafter, for the first test piece, the Ni plated layer of a 1 µm average thickness, the Pd plated layer of a 0.1 µm average thickness, and the Au plated layer of a 0.005 µm average thickness were laminated, in this order, on the etched copper-plate alloy, by using the electrolytic plating method. For the second test piece, the Ni plated layer of a 0.8 µm average thickness, the Pd plated layer of a 0.014 µm average thickness, and the Au plated layer of a 0.009 µm average thickness were laminated, in this order, on the etched copper-plate alloy, by using the electrolytic plating method.

On the other hand, for the comparative piece, the Ni plated layer of the 1 µm average thickness, the Pd plated layer of the 0.1 µm average thickness, and the Au plated layer of the 0.005 µm average thickness were laminated, in this order, on the copper-plate alloy that was not subjected to the micro-etching process, by using the electrolytic plating method, in the same manner as the first test piece.

Thereafter, the average roughness Ra of the first test piece, the second test piece and the comparative piece was measured. As a result, the average roughness Ra of the first test piece was 0.31 to 0.35 µm. The average roughness Ra of the second test piece was 0.41 µm. However, the average roughness Ra of the comparative piece was 0.05 to 0.07 µm.

Figure 17:
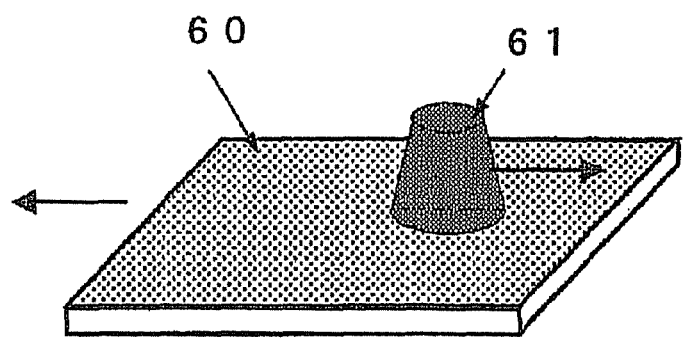
FIG. 17 is a perspective view for illustrating a method for measuring the adhesion strength.

Next, a method of measuring the adhesion strength relative to the sealing resin will be described. As shown in FIG. 17, a resin 61 was molded on each strength test piece (i.e., the first test piece, the second test piece or the comparative piece) 60 and the so-called cup shearing strength test was performed for each strength test piece with molded resin 61. First, the strength test piece (i.e., the first test piece, second test piece or comparative piece) 60 prepared by the method described above was heated on a hot plate at 220° C. for 60 seconds, and then further heated on the hot plate at 240° C. for 80 seconds. The cup-shaped resin molded on the strength test piece had been cured and formed into a truncated-cone-like shape, by heating the epoxy resin 61 under pressure of 2,000 kg at 175° C. for 120 seconds and by further heating it under the pressure of 2,000 kg at 175° C. for 5 hours.

To the so-molded epoxy resin 61 together with the adhesion strength test piece 60, a load is applied in the direction depicted by an arrow shown in FIG. 17, so as to obtain a load per unit area (i.e., shearing stress: $kN/cm^2$) by dividing a value of the load when the resin was peeled off by an area of the adhesion face. The measurement of the load when the resin was peeled off was performed by using a universal testing machine 5556 (trade name) produced by Instron Corporation. As a result, the following values were obtained as the values of the shearing strength.

(1) The first test piece (subjected to the face roughening process):
0.42 $kN/cm^2$.

(2) The second test piece (subjected to the face roughening process):
0.67 $kN/cm^2$.

(3) The comparative piece (not subjected to the face roughening process):
0.04 $kN/cm^2$.

That is to say, in the case in which both of the face roughening process and the plating process were performed, the adhesion strength between the sealing resin and the copper-alloy plate can be significantly enhanced, as compared with the case in which only the plating process was performed.

What is claimed:

1. A manufacturing method for a circuit member, comprising the steps of:
   providing a lead frame material made from a rolled copper plate or a rolled copper-alloy plate, the lead frame material including a die pad, a lead part adapted to be electrically connected with a semiconductor chip to be mounted on the die pad, and an outer frame configured to support the die pad and the lead part;
   forming a roughened face, having an average roughness Ra of 0.3 µm or greater, on a surface in a resin sealing region of the lead frame material by using a micro-etching liquid mainly containing hydrogen peroxide and sulfuric acid, the resin sealing region being adapted to be sealed by a resin together with the semiconductor chip mounted on the die pad; and
   forming a two-layer plated layer formed by laminating a Ni plated layer and a Pd plated layer in this order, or a three-layer plated layer formed by laminating the Ni plated layer, the Pd plated layer and an Au plated layer in this order, on a whole surface of the lead frame material in which the roughened face is partially formed.

2. The manufacturing method for the circuit member according to claim 1, wherein the roughened face is formed on a top surface, a side surface and a bottom surface, in the resin sealing region of the lead frame material.

3. The manufacturing method for the circuit member according to claim 1, wherein the step of forming the roughened face includes the steps of:
   holding the lead frame material from both sides, by using a jig configured to surround the resin sealing region of the lead frame material so as to mask a region outside the resin sealing region; and
   discharging the micro-etching liquid into the jig from both sides of the lead frame material so as to fill the interior of the jig surrounding the resin sealing region of the lead frame material with the micro-etching liquid.

4. The manufacturing method for the circuit member according to claim 1, wherein the step of forming the roughened face includes the steps of:
   sticking protective films onto both sides of the lead frame material, each protective film having an opening formed therein to expose the resin sealing region of the lead frame material; and
   injecting the micro-etching liquid toward the inside of the openings of the protective films from both sides of the lead frame material.

5. The manufacturing method for the circuit member according to claim 1, wherein the step of forming the roughened face includes the steps of:
   sticking protective films onto both sides of the lead frame material, each protective film having an opening formed therein to expose the resin sealing region of the lead frame material; and
   immersing the lead frame material, with the protective films stuck onto the lead frame material, in the micro-etching liquid.

6. A manufacturing method for a circuit member, comprising the steps of:
   providing a lead frame material made from a rolled copper plate or a rolled copper-alloy plate, the lead frame material including a die pad, a lead part adapted to be electrically connected via bonding wire with a semiconductor chip to be mounted on the die pad, and an outer frame configured to support the die pad and the lead part;
   forming a single plated layer composed of an Ag plated layer, a two-layer plated layer formed by laminating a Ni plated layer and a Pd plated layer in this order, or a three-layer plated layer formed by laminating the Ni plated layer, the Pd plated layer and an Au plated layer in this order, on a surface of the die pad opposed to the semiconductor chip as well as on a portion, to be connected with the bonding wire, of a surface of the lead part; and
   forming a roughened face having an average roughness Ra of 0.3 µm or greater on a portion, on which no plated layer is formed, of a surface in a resin sealing region of the lead frame material by using a micro-etching liquid mainly containing hydrogen peroxide and the sulfuric acid, the resin sealing region being adapted to be sealed by a resin, together with the semiconductor chip located on the die pad and the bonding wire, wherein the step of forming the roughened face includes the steps of:
   holding the lead frame from both sides, by using a jig configured to surround the resin sealing region of the lead frame material so as to mask a region outside the resin sealing region; and
   discharging the micro-etching liquid into the jig from both sides of the lead frame material so as to fill the interior of the jig surrounding the resin sealing region of the lead frame material with the micro-etching liquid.

7. The manufacturing method for the circuit member according to claim 6,
   wherein the plated layer is formed on a top surface of the die pad as well as on a portion, to be connected with the bonding wire, of a top surface of the lead part, and
   wherein the roughened face is formed on a portion of a top surface, a side surface and a bottom surface, in the resin scaling region of the lead frame material.

8. A manufacturing method for a circuit member, comprising the steps of:
   providing a lead frame material made from a rolled copper plate or a rolled copper-alloy plate, the lead frame material including a die pad, a lead part adapted to be electrically connected via bonding wire with a semiconductor chip to be mounted on the die pad, and an outer frame configured to support the die pad and the lead part;
   forming a single plated layer composed of an Ag plated layer, a two-layer plated layer formed by laminating a Ni plated layer and a Pd plated layer in this order, or a three-layer plated layer formed by laminating the Ni plated layer, the Pd plated layer and an Au plated layer in this order, on a surface of the die pad opposed to the semiconductor chip as well as on a portion, to be connected with the bonding wire, of a surface of the lead part; and
   forming a roughened face having an average roughness Ra of 0.3 µm or greater on a portion, on which no plated layer is formed, of surface in a resin sealing, region of the lead frame material by using a micro-etching liquid mainly containing hydrogen peroxide and the sulfuric acid, the resin sealing region being, adapted to be sealed by a resin, together with the semiconductor chip located on the die pad and the bonding wire wherein the step of forming the roughened face includes the steps of:
   sticking protective films onto both sides of the lead frame material, each protective film having an opening formed therein to expose the resin sealing region of the lead frame material; and injecting the micro-etching liquid toward the inside of the openings of the protective films from both sides of the lead frame material.

9. A manufacturing method for a circuit member, comprising the steps of:
provide a lead frame material made from a rolled copper plate or a rolled copper-alloy plate, the lead frame material including a die pad, a lead part adapted to be electrically connected via bonding wire with a semiconductor chip to be mounted on the die pad, and an outer frame configured to support the die pad and the lead part;
forming a single plated layer composed of an Ag plated layer, a two-layer plated layer formed by laminating a Ni plated layer and a Pd plated layer in this order, or a three-layer plated layer formed by laminating the Ni plated layer, the Pd plated layer and an Au plated layer in this order, on a surface of the die pad opposed to the semiconductor chip as well as on a portion, to be corrected with the bonding wire, of a surface of the lead part; and
forming a roughened face having an average roughness Ra of 0.3 μm or greater on a portion, on which no plated layer is formed, of a surface in a resin sealing region of the frame material by using a micro-etching liquid mainly containing hydrogen peroxide and the sulfuric acid, the resin sealing region being adapted to be sealed by a resin, together with the semiconductor chip located on the die pad and the bonding wire, wherein the step of forming the roughened face includes the steps of:
sticking protective films onto both sides of the lead frame material, each protective film having an opening formed therein to expose the resin sealing region of the lead frame material; and
immersing the lead frame material, with the protective films stuck onto the lead frame material, in the micro-etching liquid.

10. The manufacturing method for the circuit member according to claim 8,
wherein the plated layer is formed on a top surface of the die pad as well as on a portion, to be connected with the bonding wire, of a top surface of the lead part, and
wherein the roughened face is formed on a portion of a top surface, a side surface and a bottom surface, in the resin sealing region of the lead frame material.

11. The manufacturing method for the circuit member according to claim 9, wherein the plated layer is formed on a top surface of the die pad as well as on a portion, to be connected with the bonding wire, of a top surface of the lead part, and
wherein the roughened face is formed on a portion of a top surface, a side surface and a bottom surface, in the resin sealing region of the lead frame material.

* * * * *

UNITED STATES PATENT AND TRADEMARK OFFICE
CERTIFICATE OF CORRECTION

| | |
|---|---|
| PATENT NO. | : 8,420,446 B2 |
| APPLICATION NO. | : 13/012268 |
| DATED | : April 16, 2013 |
| INVENTOR(S) | : Shimazaki Yo et al. |

Page 1 of 1

It is certified that error appears in the above-identified patent and that said Letters Patent is hereby corrected as shown below:

In the Claims:

Column 26, line 21: Please insert -- material -- after frame

Column 26, line 36: Please change "scaling" to -- sealing --

Column 26, line 55: Please change "sealing," to -- sealing --

Column 26, line 58: Please change "being," to -- being --

Column 26, line 60: Please change "wire" to -- wire, --

Column 27, line 8: Please change "pad,a" to -- pad, a --

Column 27, line 24: Please change "the frame" to -- the lead frame --

Signed and Sealed this
Thirtieth Day of July, 2013

Teresa Stanek Rea
*Acting Director of the United States Patent and Trademark Office*